US012159919B2

(12) United States Patent
Graettinger

(10) Patent No.: US 12,159,919 B2
(45) Date of Patent: Dec. 3, 2024

(54) REPLACEMENT GATE FORMATION IN MEMORY

(71) Applicant: Micron Technology, Inc., Boise, ID (US)

(72) Inventor: Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 18/196,891

(22) Filed: May 12, 2023

(65) Prior Publication Data

US 2023/0282730 A1    Sep. 7, 2023

Related U.S. Application Data

(63) Continuation of application No. 17/314,956, filed on May 7, 2021, now Pat. No. 11,652,153.

(51) Int. Cl.
*H01L 29/66* (2006.01)
*H01L 27/06* (2006.01)
*H10B 63/00* (2023.01)
*H10N 70/00* (2023.01)
*H10N 70/20* (2023.01)

(52) U.S. Cl.
CPC .... *H01L 29/66545* (2013.01); *H01L 27/0688* (2013.01); *H10B 63/84* (2023.02); *H10N 70/011* (2023.02); *H10N 70/253* (2023.02)

(58) Field of Classification Search
CPC .......... H01L 29/66; H01L 27/06; H01L 63/00
See application file for complete search history.

(56) References Cited

U.S. PATENT DOCUMENTS

| 8,536,040 | B1 | 9/2013 | Park |
| 9,112,032 | B1 | 8/2015 | Liu et al. |
| 10,700,128 | B1 | 6/2020 | Fantini et al. |
| 10,886,383 | B2 | 1/2021 | Ho et al. |
| 2015/0171082 | A1 | 6/2015 | Choi et al. |
| 2017/0148805 | A1 | 5/2017 | Nishikawa et al. |
| 2020/0350203 | A1 | 11/2020 | Fratin et al. |

OTHER PUBLICATIONS

Application and Drawings from International Application No. PCT/IB2020/000102, filed on Mar. 18, 2020, entitled, "Method for Manufacturing a Memory Device and Memory Device Manufactured Through the Same Method", 57 pages.

*Primary Examiner* — Marvin Payen
(74) *Attorney, Agent, or Firm* — Brooks, Cameron & Huebsch, PLLC

(57) ABSTRACT

The present disclosure includes methods for replacement gate formation in memory, and apparatuses and systems including memory formed accordingly. An embodiment includes forming a first oxide material in an opening through alternating layers of a second oxide material and a nitride material. An array of openings can be formed through the first oxide material formed in the opening. The layers of the nitride material can be removed. A metal material can be formed in voids resulting from the removal of the layers of the nitride material.

20 Claims, 33 Drawing Sheets

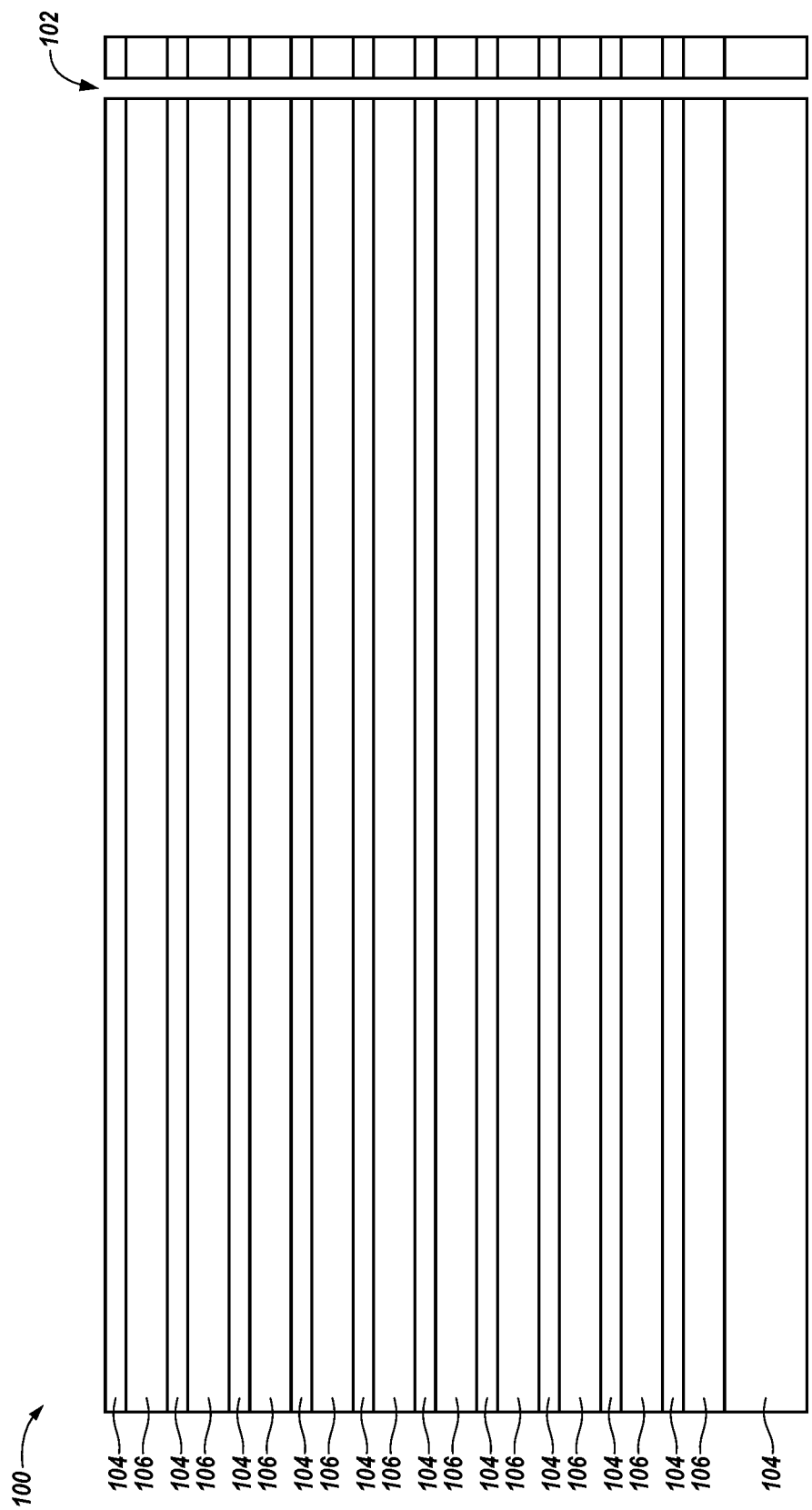
FIG. 1B (SECTION A-A)

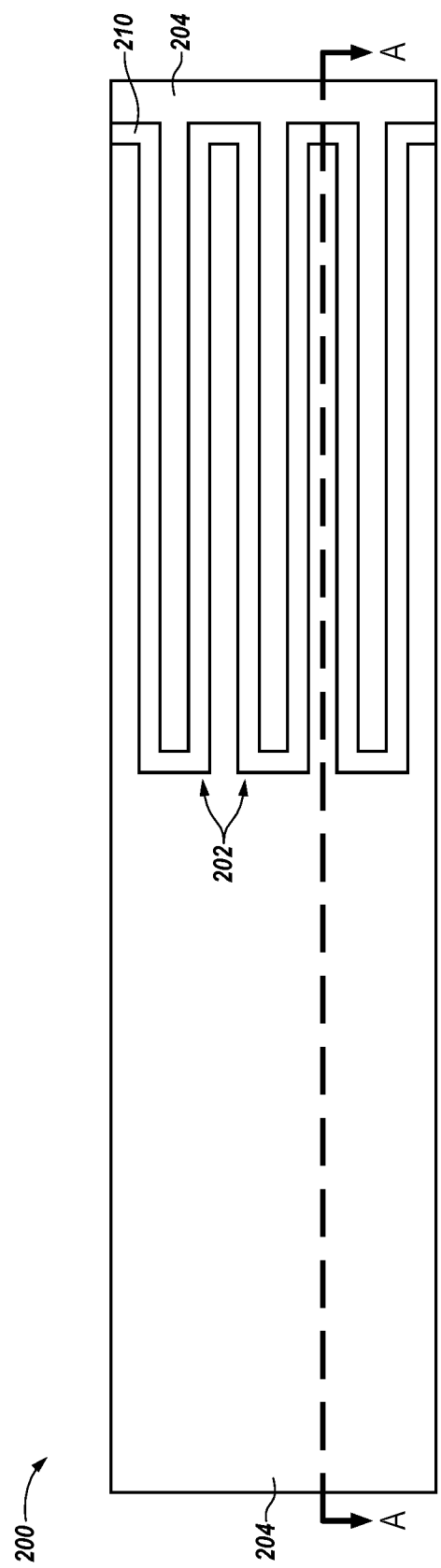

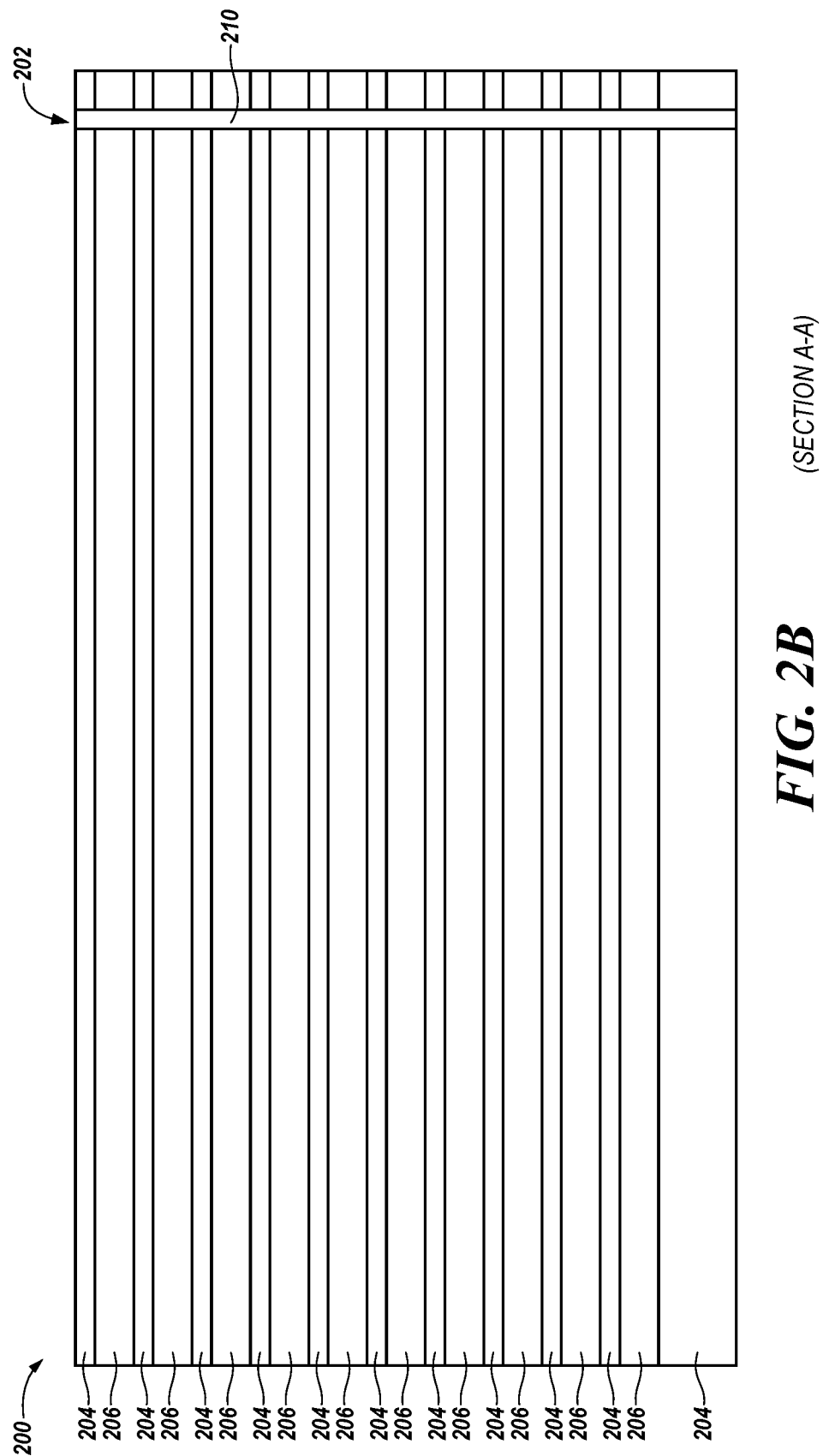
FIG. 2B (SECTION A-A)

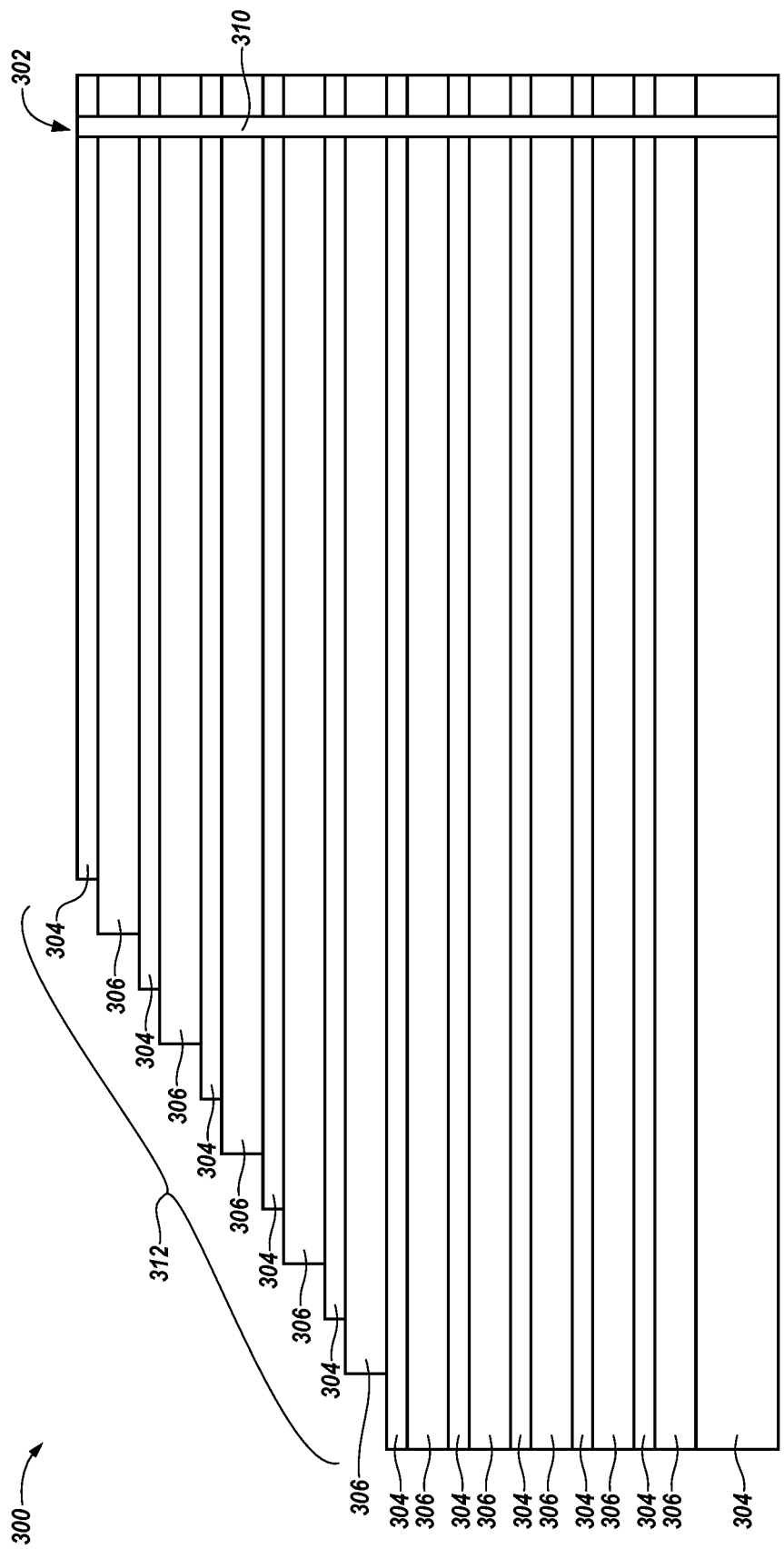
FIG. 3 (SECTION A-A)

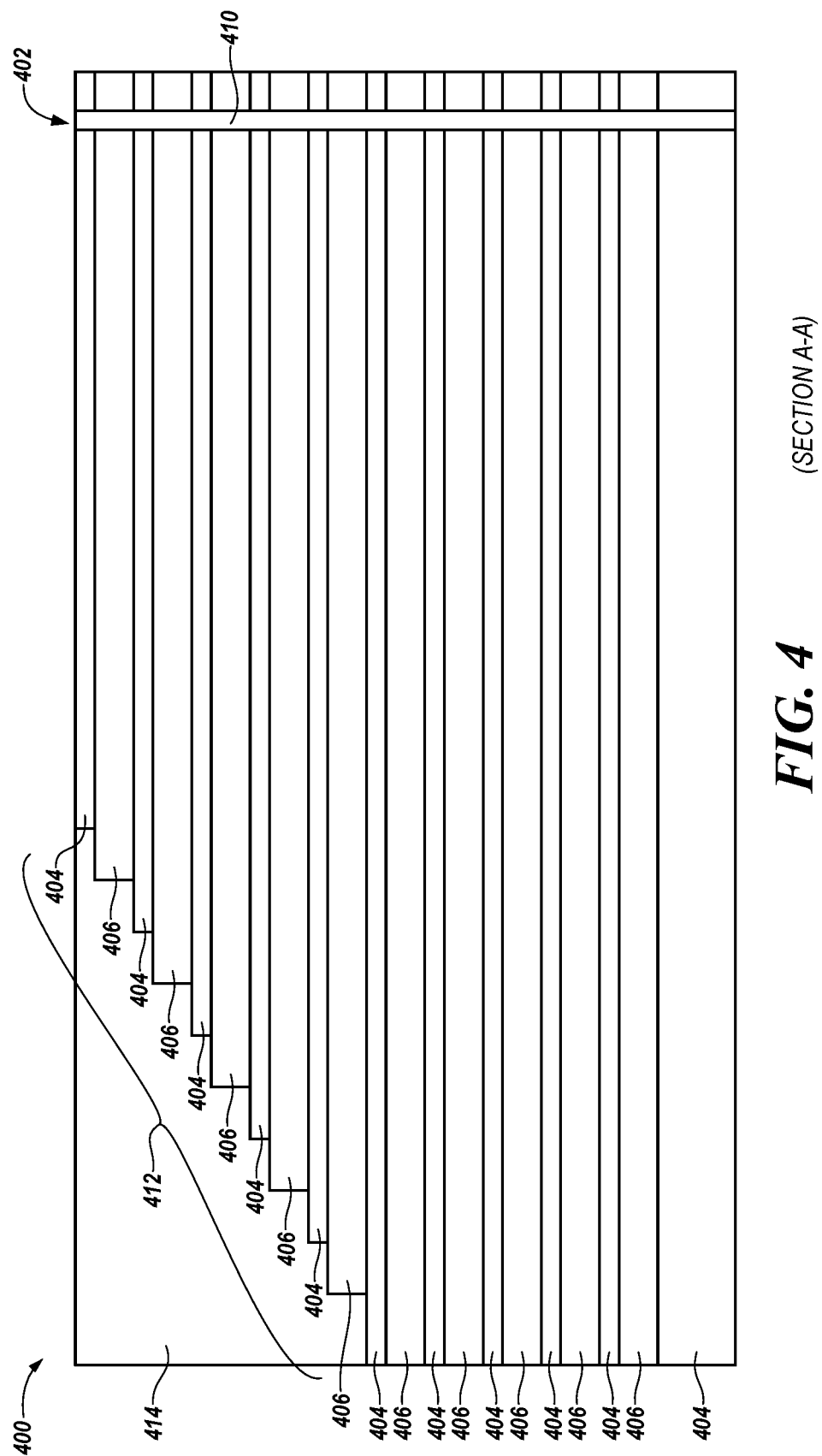
FIG. 4 (SECTION A-A)

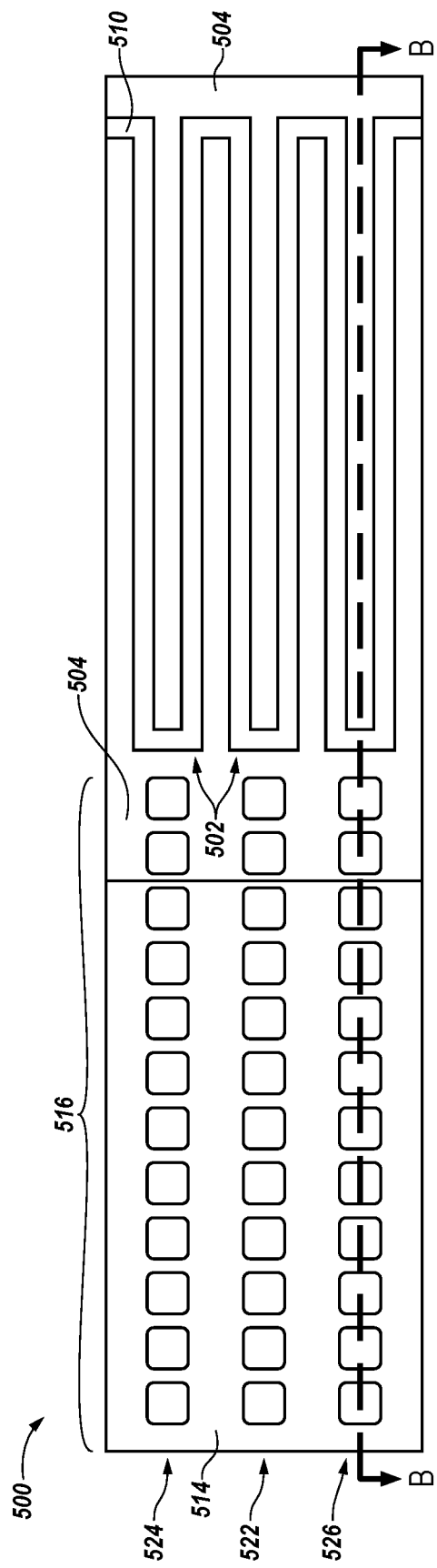

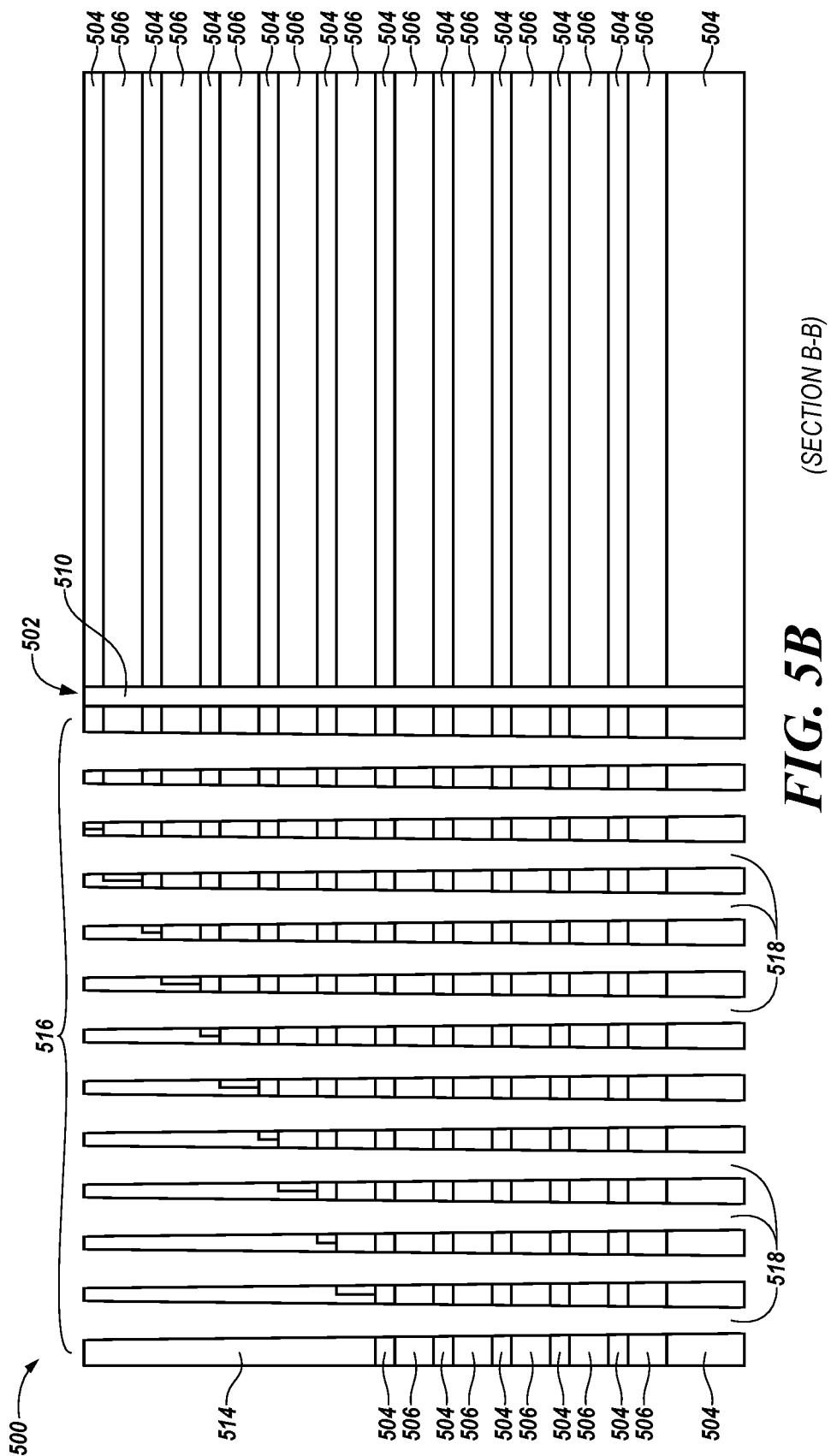
FIG. 5B (SECTION B-B)

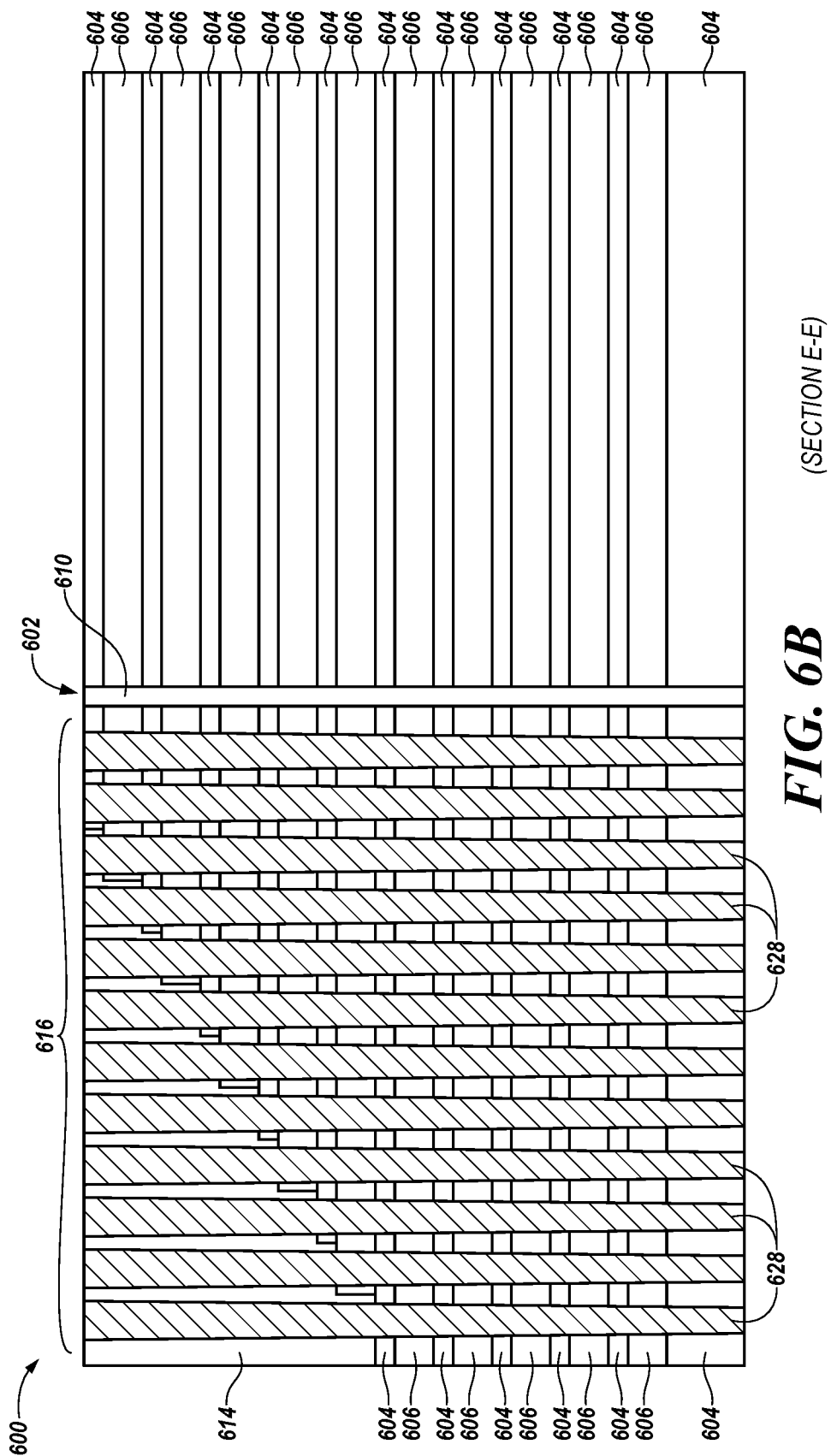
FIG. 6B (SECTION E-E)

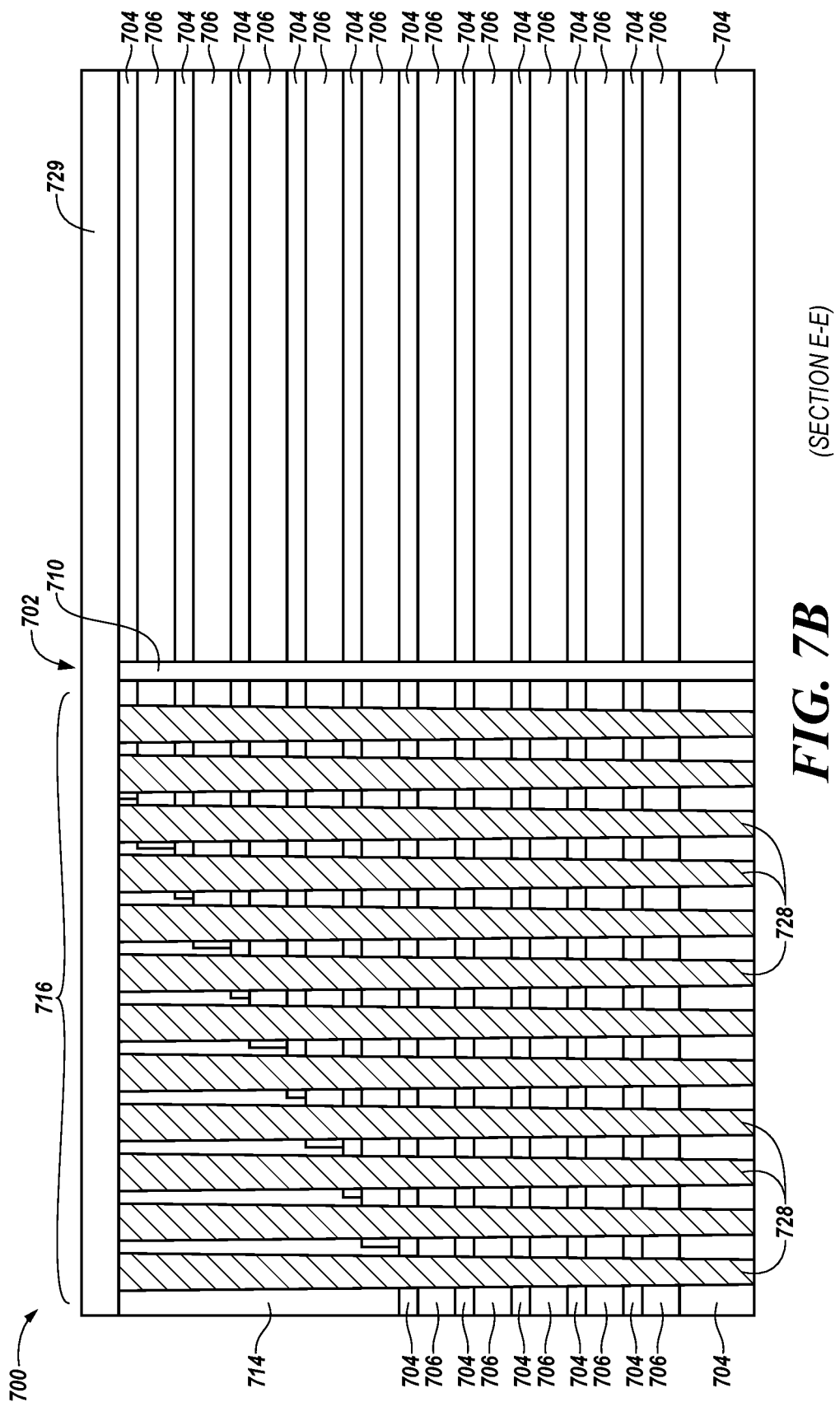
FIG. 7B (SECTION E-E)

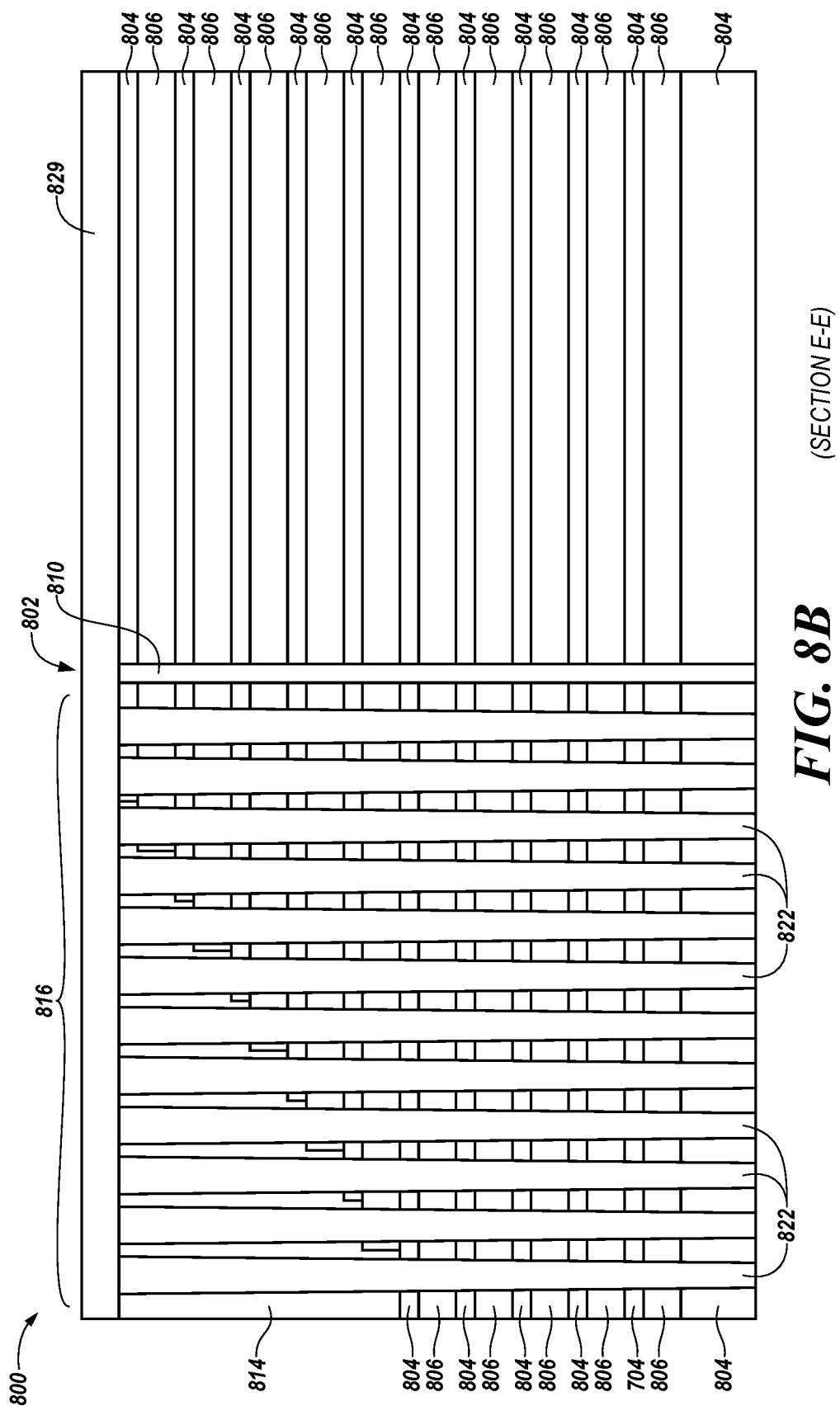
FIG. 8B (SECTION E-E)

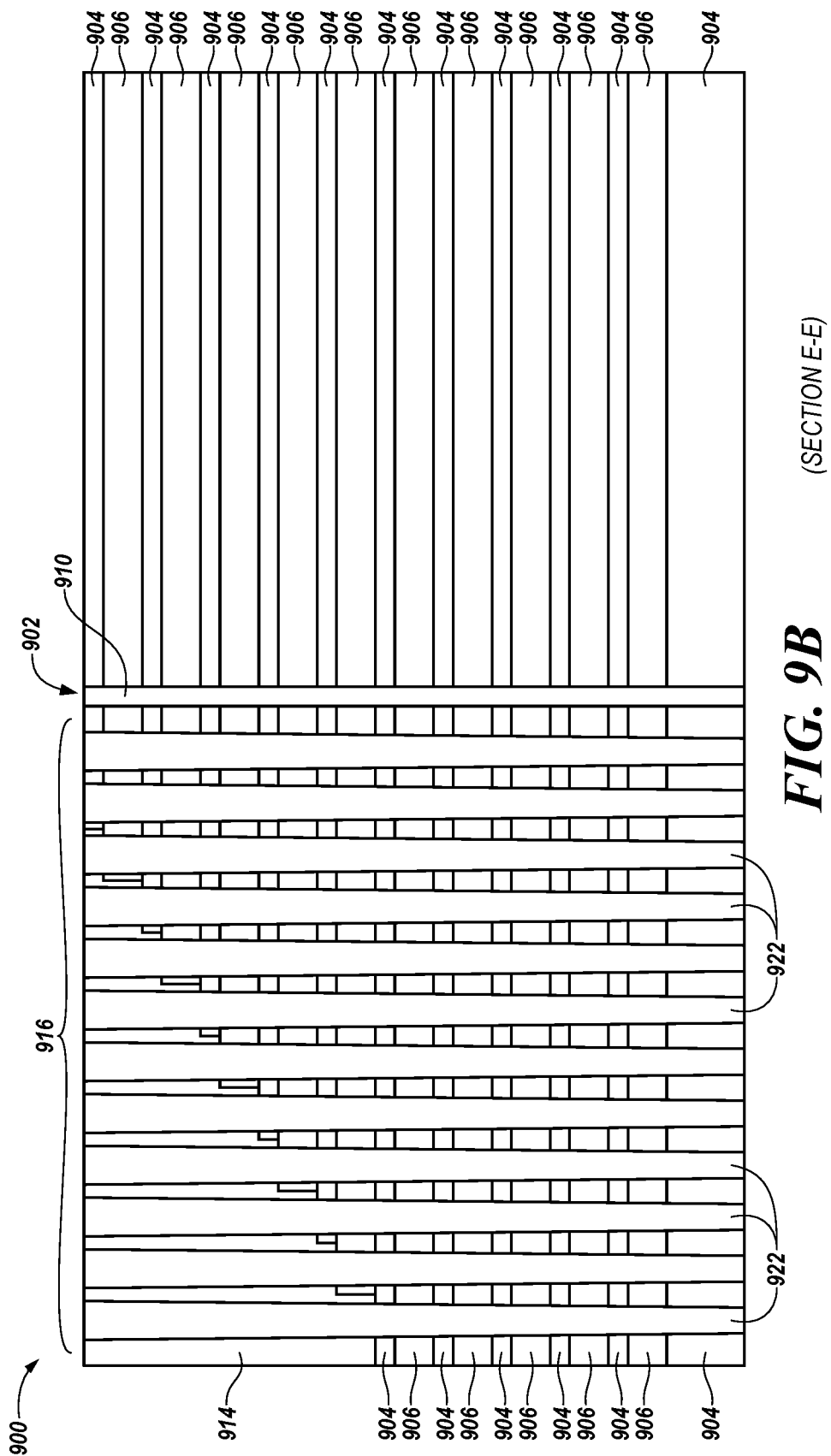
FIG. 9B (SECTION E-E)

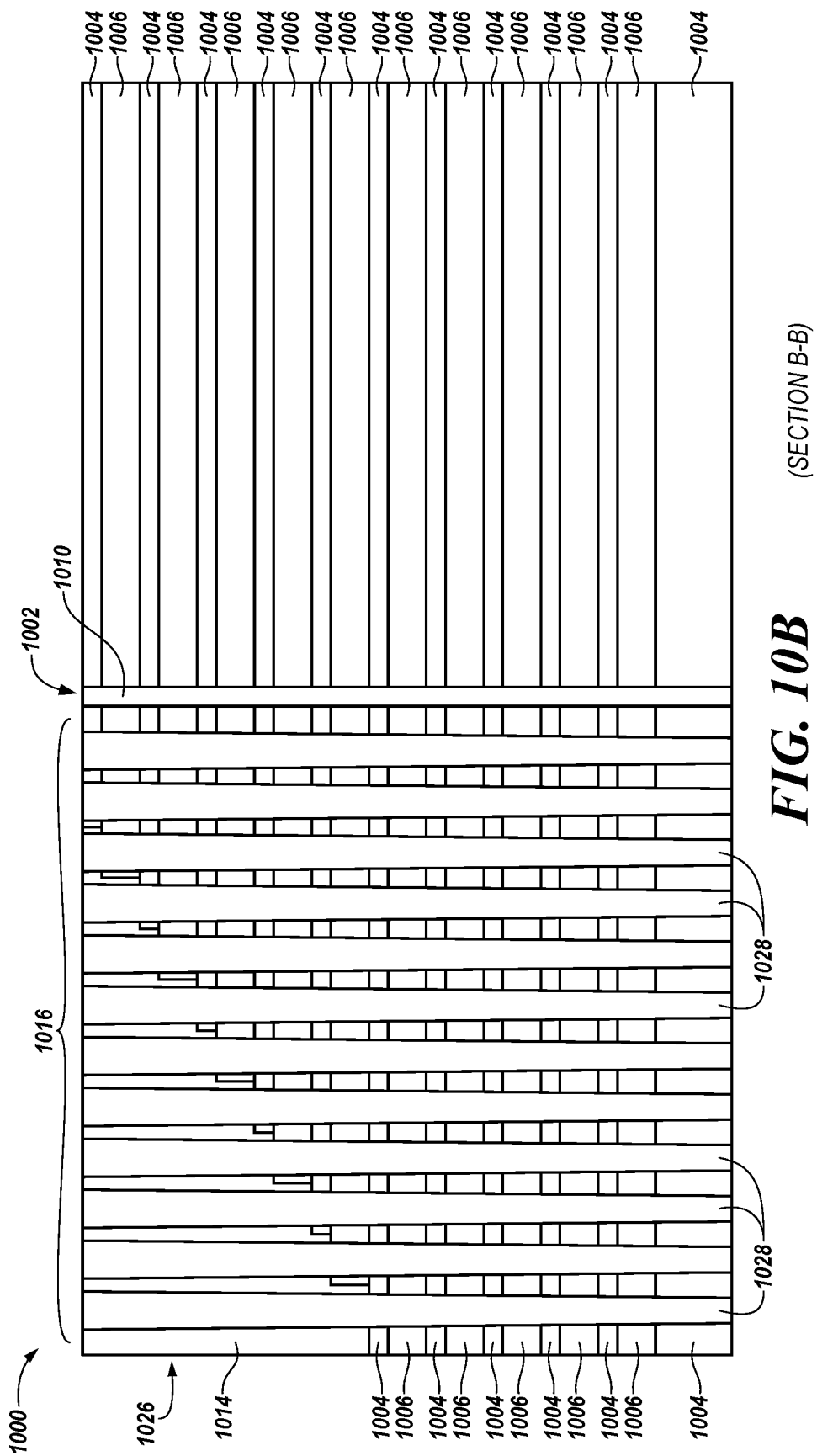
FIG. 10B (SECTION B-B)

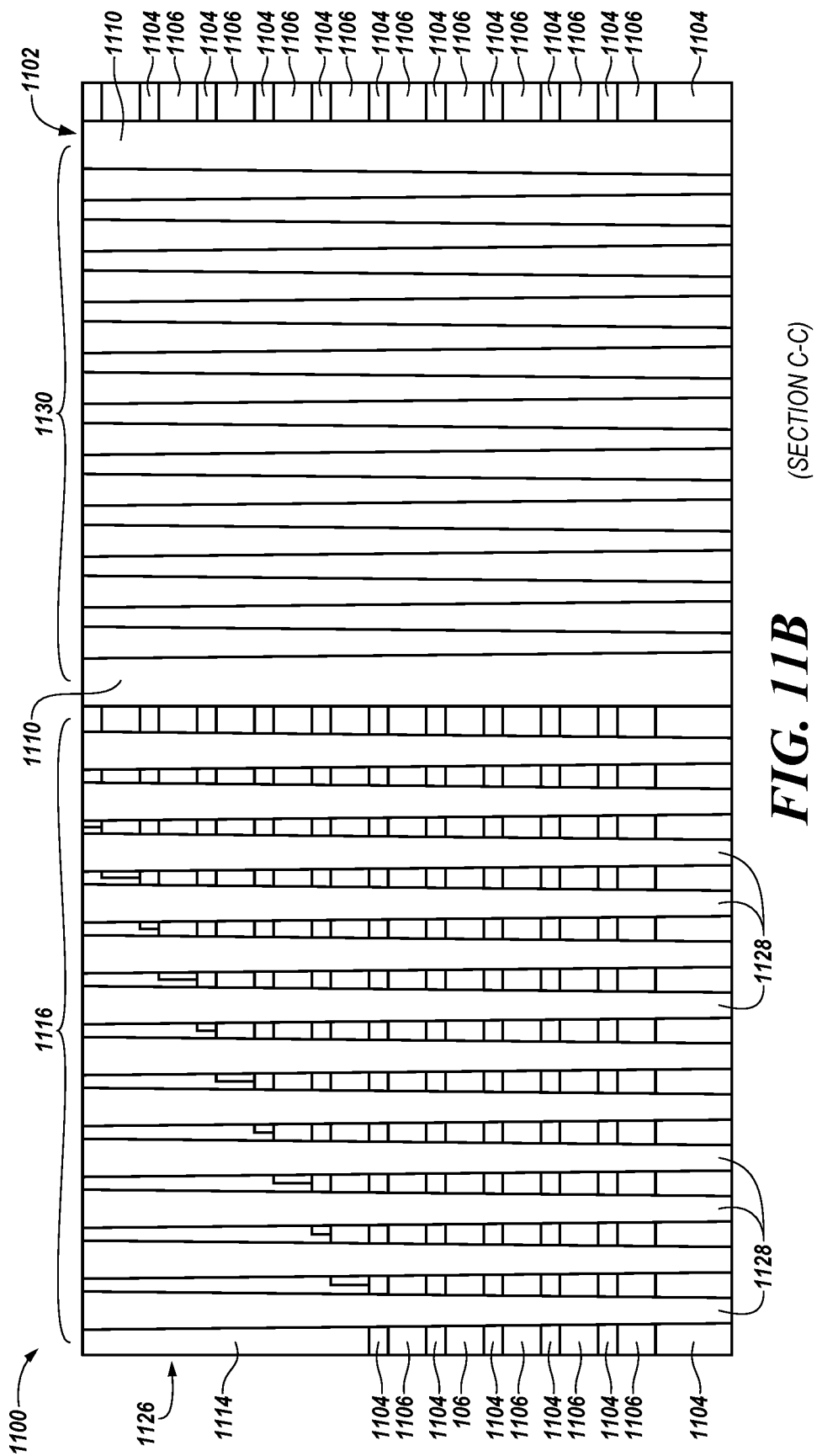
FIG. 11B (SECTION C-C)

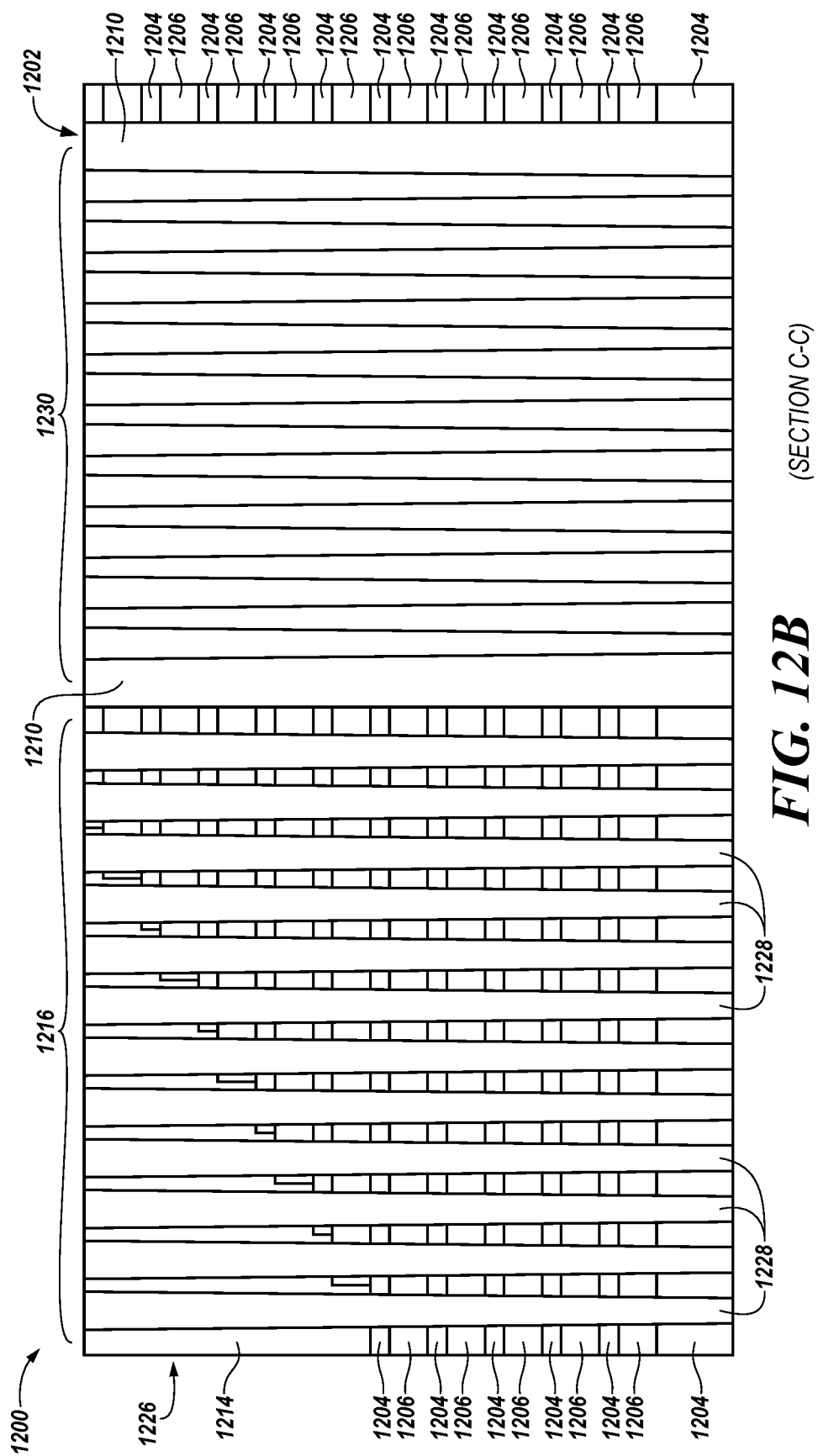
FIG. 12B (SECTION C-C)

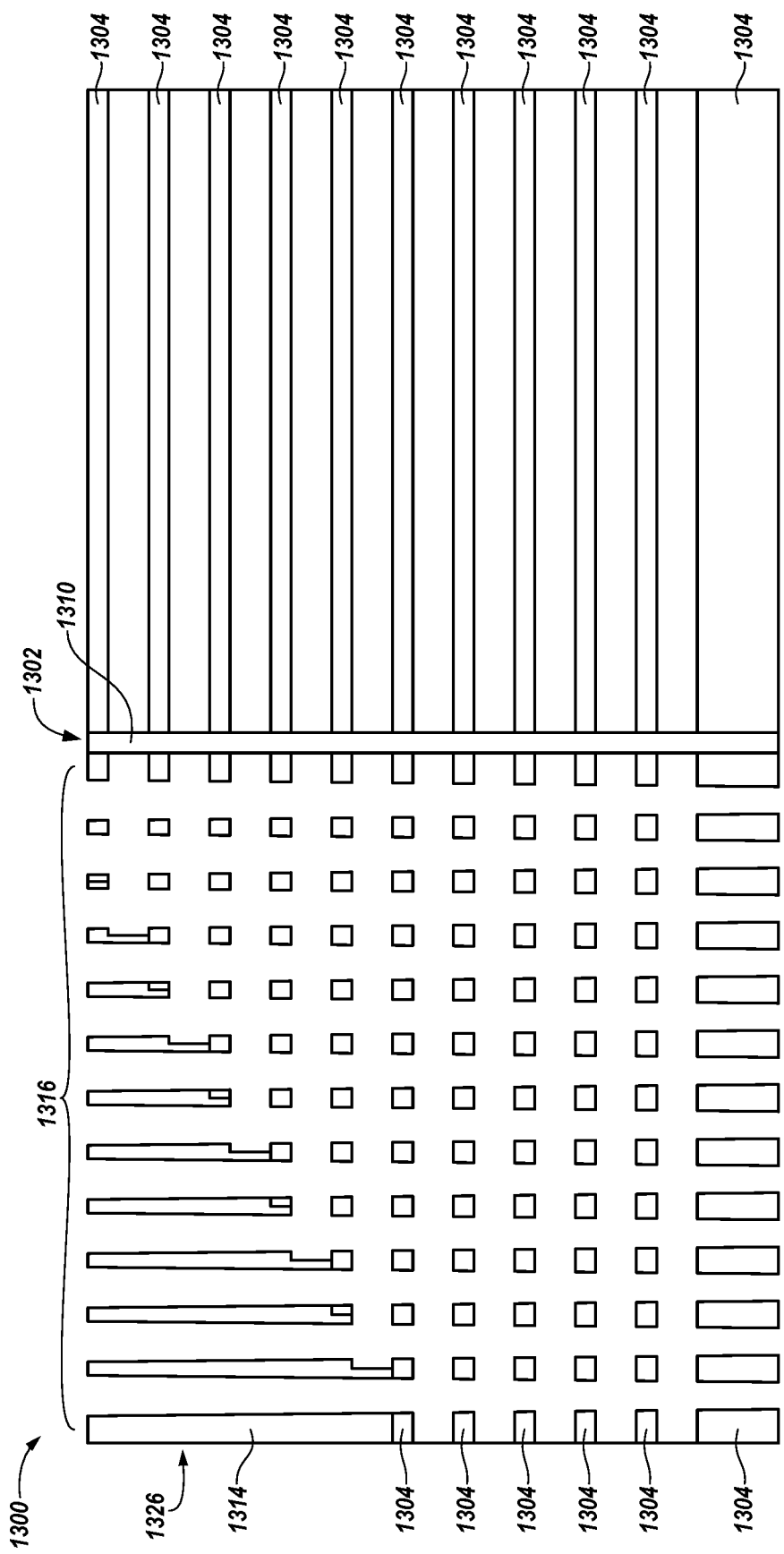
FIG. 13B (SECTION B-B)

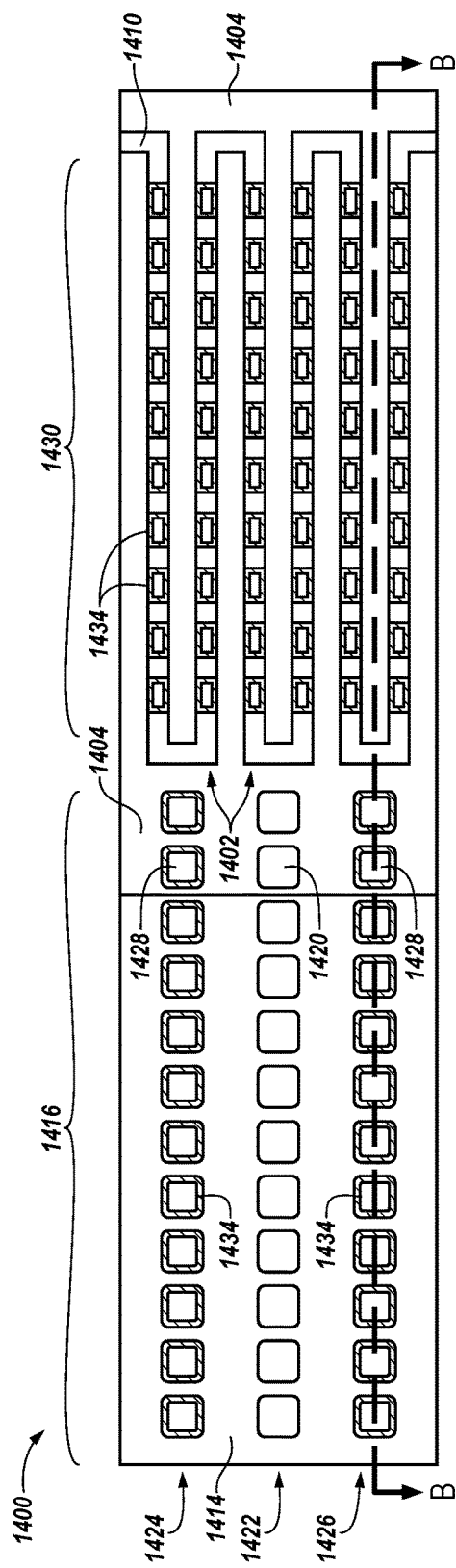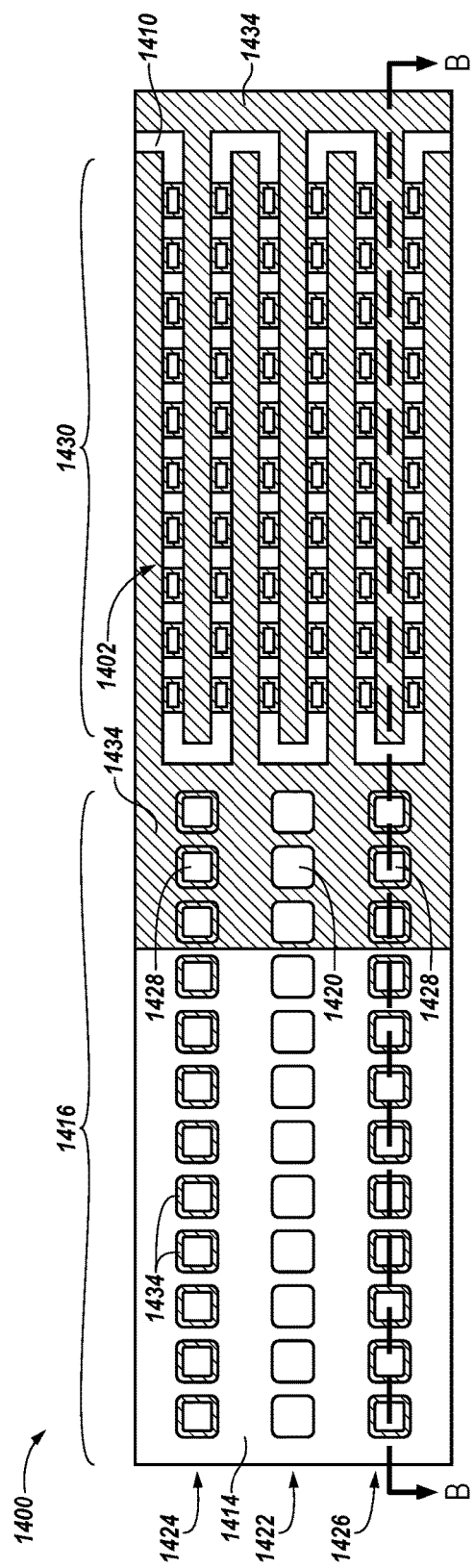

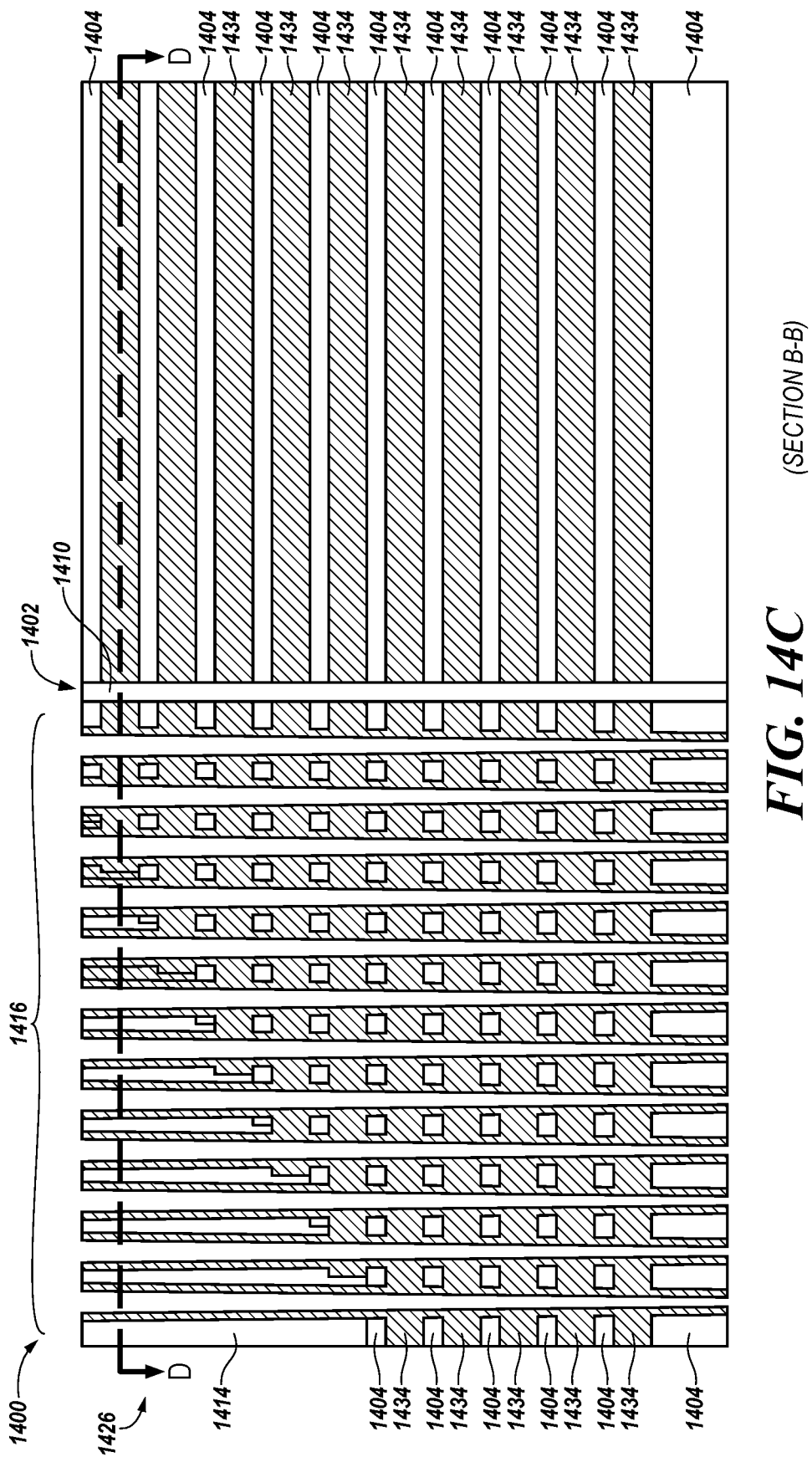
FIG. 14C (SECTION B-B)

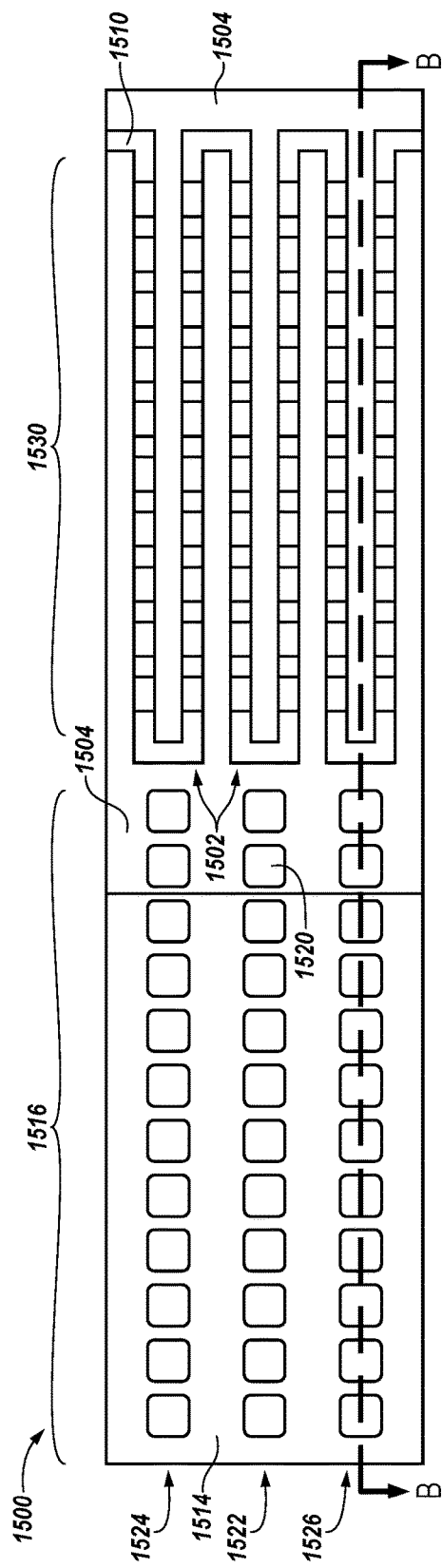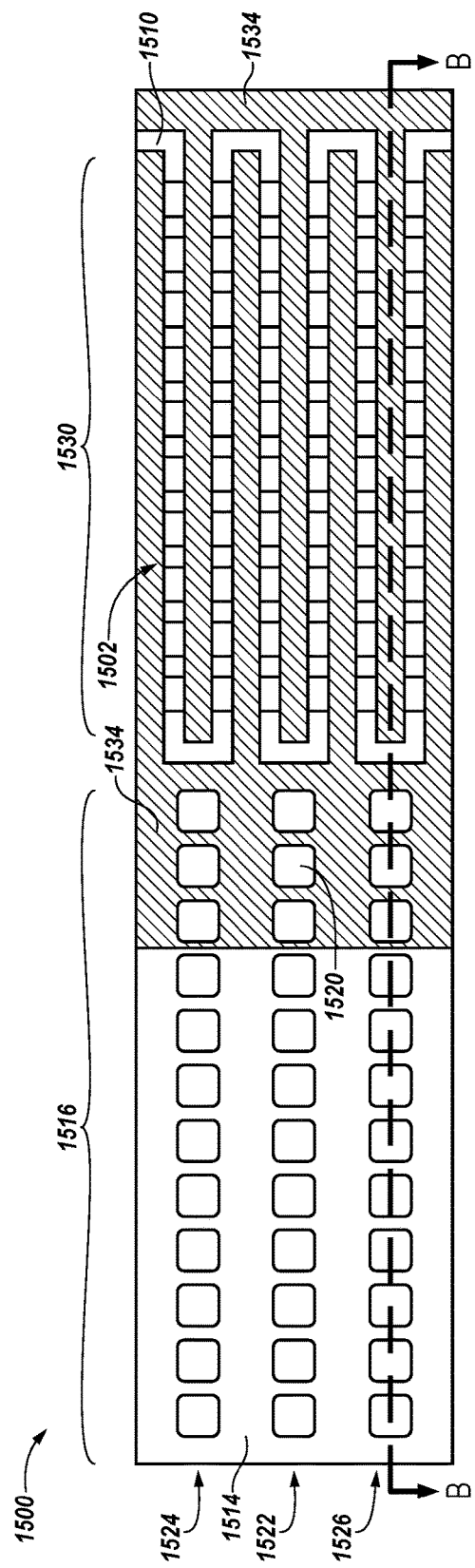

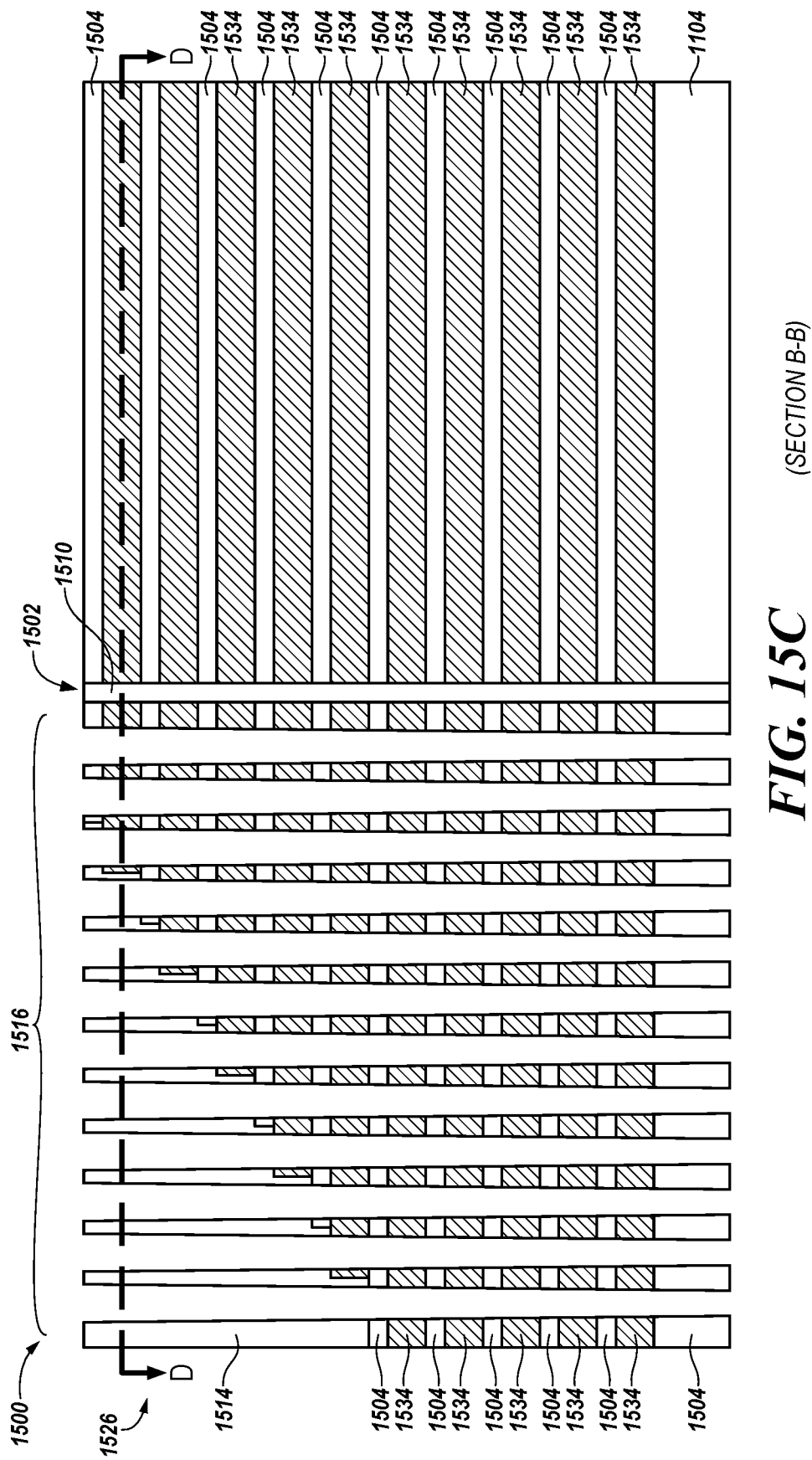
FIG. 15C (SECTION B-B)

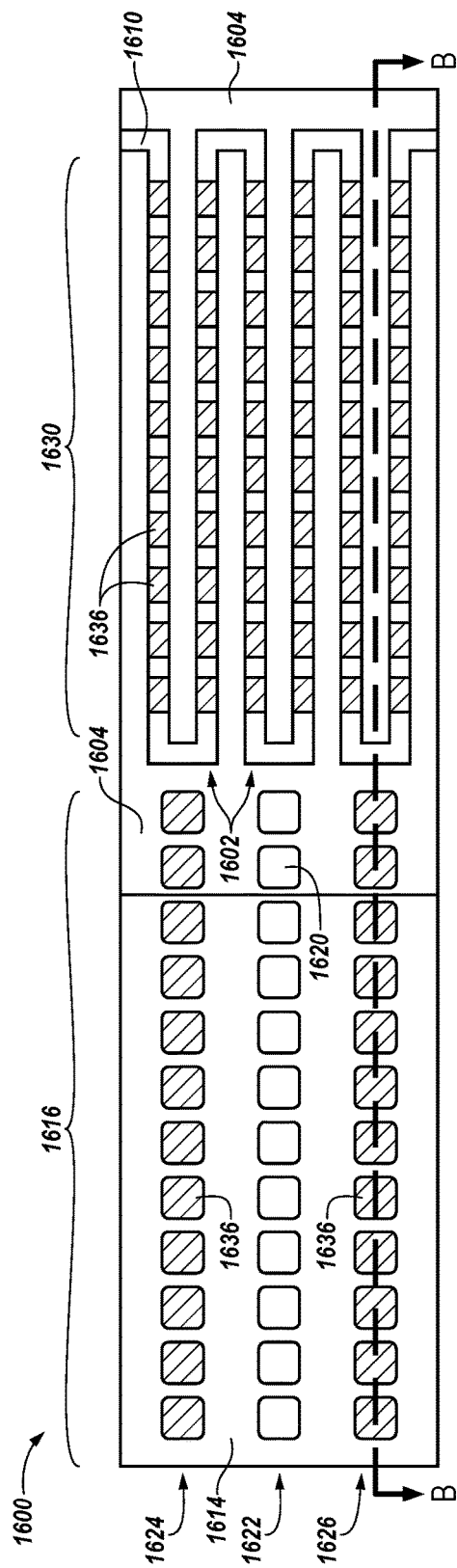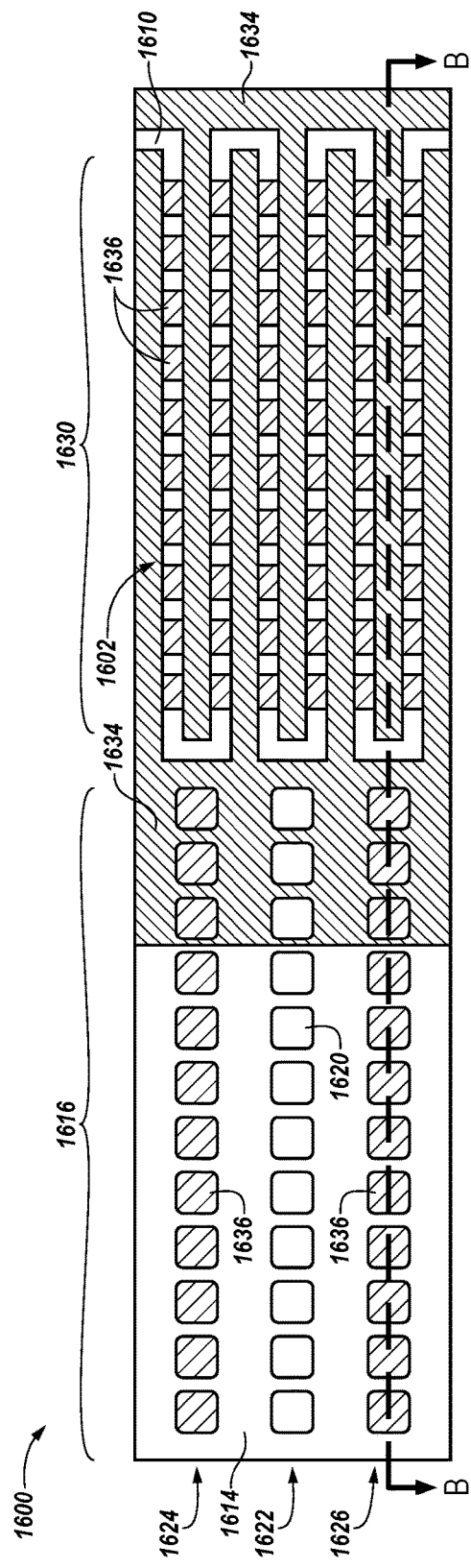

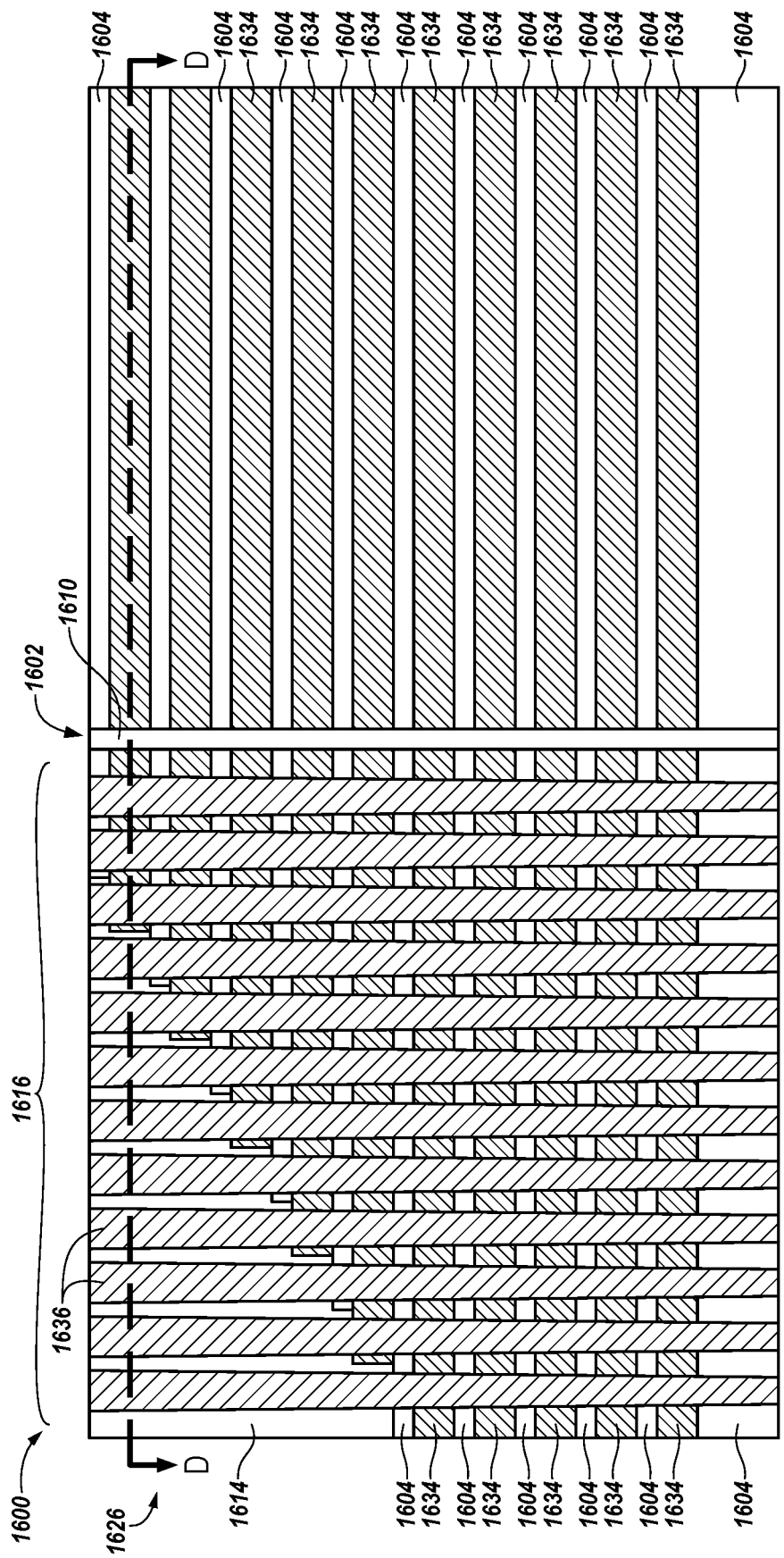
FIG. 16C (SECTION B-B)

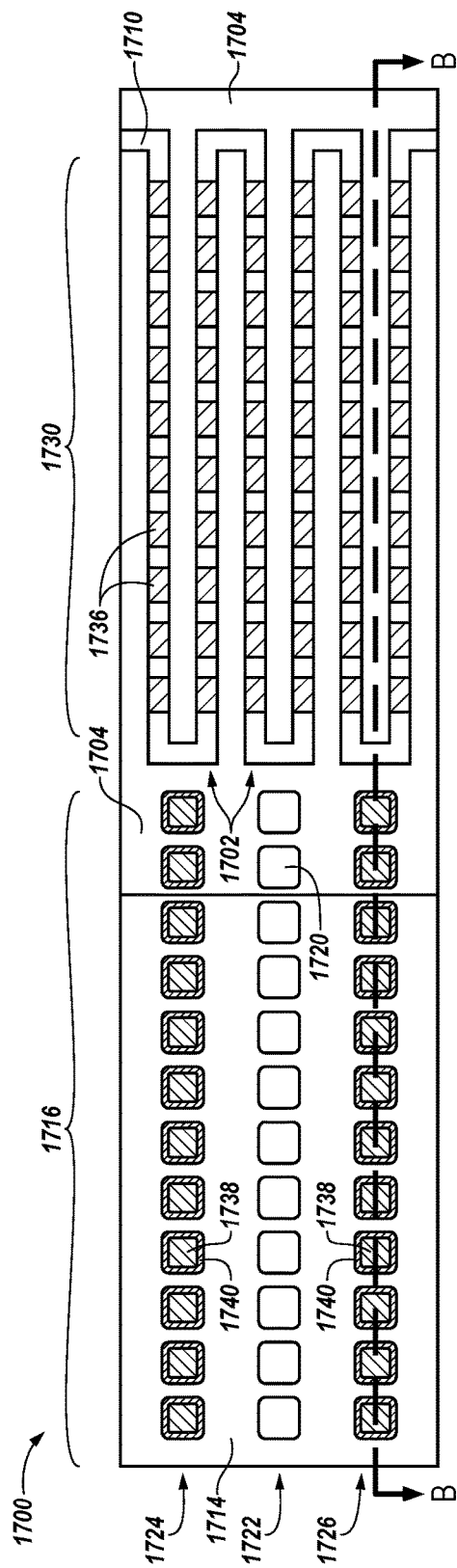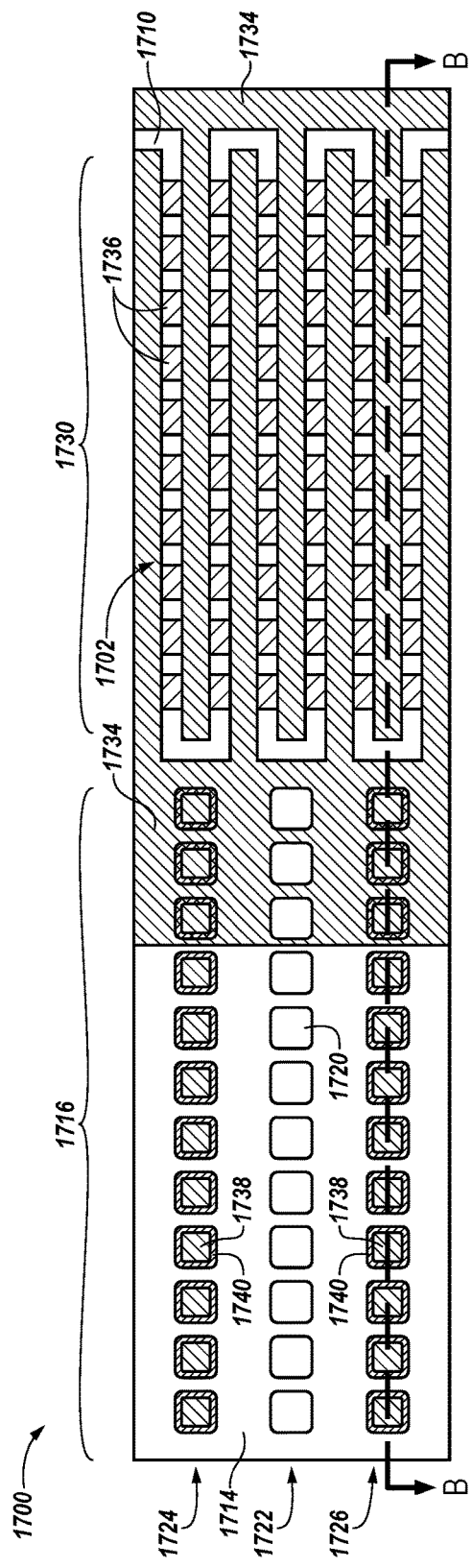

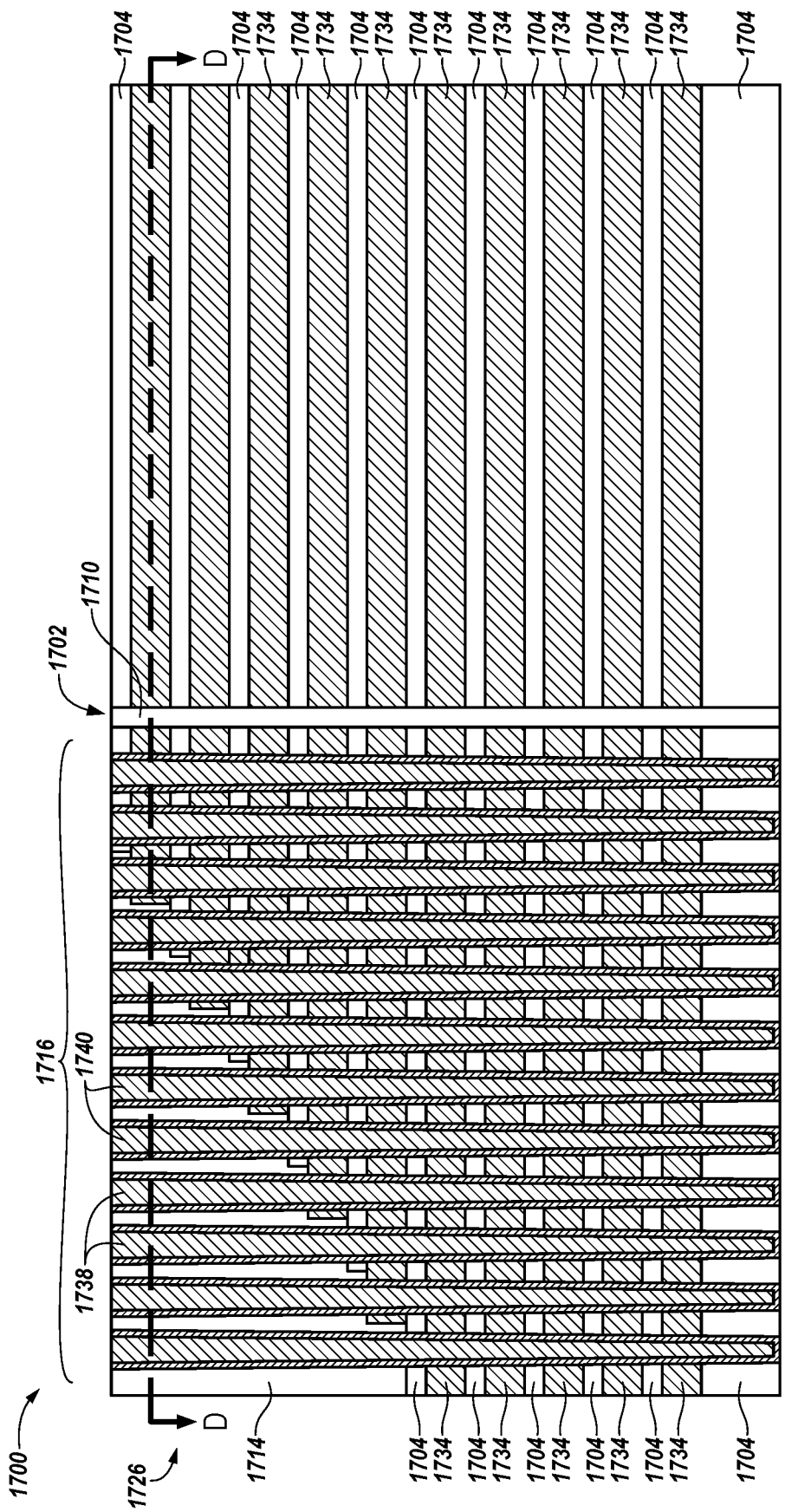
FIG. 17C (SECTION B-B)

REPLACEMENT GATE FORMATION IN MEMORY

PRIORITY INFORMATION

This application is a continuation of U.S. application Ser. No. 17/314,956, filed on May 7, 2021, which will issue as U.S. Pat. No. 11,652,153 on May 16, 2023, the contents of which are incorporated herein by reference.

TECHNICAL FIELD

The present disclosure relates generally to semiconductor memory and methods, and more particularly, to replacement gate formation in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

One of a number of data states (e.g., resistance states) can be set for a resistive memory cell. For example, a single level memory cell (SLC) can be programmed to a targeted one of two different data states, which can be represented by the binary units 1 or 0 and can depend on whether the cell is programmed to a resistance above or below a particular level. As an additional example, some resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells because each cell can represent more than one digit (e.g., more than one bit).

BRIEF DESCRIPTION OF THE DRAWINGS

FIGS. 1A-1B illustrate various views of a processing step associated with forming a three-dimensional (3-D) memory array in accordance with an embodiment of the present disclosure.

FIGS. 2A-2B illustrate various views of a subsequent processing step associated with forming the 3-D memory array in accordance with an embodiment of the present disclosure.

FIG. 3 illustrates a schematic cross-sectional view of a subsequent processing step associated with forming the 3-D memory array in accordance with an embodiment of the present disclosure.

FIG. 4 illustrates a schematic cross-sectional view of a subsequent processing step associated with forming the 3-D memory array in accordance with an embodiment of the present disclosure.

FIGS. 5A-5B illustrate various views of a subsequent processing step associated with forming the 3-D memory array in accordance with an embodiment of the present disclosure.

FIGS. 6A-6B illustrate various views of subsequent processing steps associated with forming the 3-D memory array in accordance with an embodiment of the present disclosure.

FIGS. 7A-7B illustrate various views of a subsequent processing step associated with forming the 3-D memory array in accordance with an embodiment of the present disclosure.

FIGS. 8A-8B illustrate various views of a subsequent processing step associated with forming the 3-D memory array in accordance with an embodiment of the present disclosure.

FIGS. 9A-9B illustrate various views of a subsequent processing step associated with forming the 3-D memory array in accordance with an embodiment of the present disclosure.

FIGS. 10A-10B illustrate various views of a subsequent processing step associated with forming the 3-D memory array in accordance with an embodiment of the present disclosure.

FIGS. 11A-11B illustrate various views of a subsequent processing step associated with forming the 3-D memory array in accordance with an embodiment of the present disclosure.

FIGS. 12A-12B illustrate various views of a subsequent processing step associated with forming the 3-D memory array in accordance with an embodiment of the present disclosure.

FIGS. 13A-13B illustrate various views of a subsequent processing step associated with forming the 3-D memory array in accordance with an embodiment of the present disclosure.

FIGS. 14A-14C illustrate various views of a subsequent processing step associated with forming the 3-D memory array in accordance with an embodiment of the present disclosure.

FIGS. 15A-15C illustrate various views of a subsequent processing step associated with forming the 3-D memory array in accordance with an embodiment of the present disclosure.

FIGS. 16A-16C illustrate various views of a subsequent processing step associated with forming the 3-D memory array in accordance with an embodiment of the present disclosure.

FIGS. 17A-17C illustrate various views of subsequent processing steps associated with forming the 3-D memory array in accordance with an embodiment of the present disclosure.

DETAILED DESCRIPTION

Figure 1A:
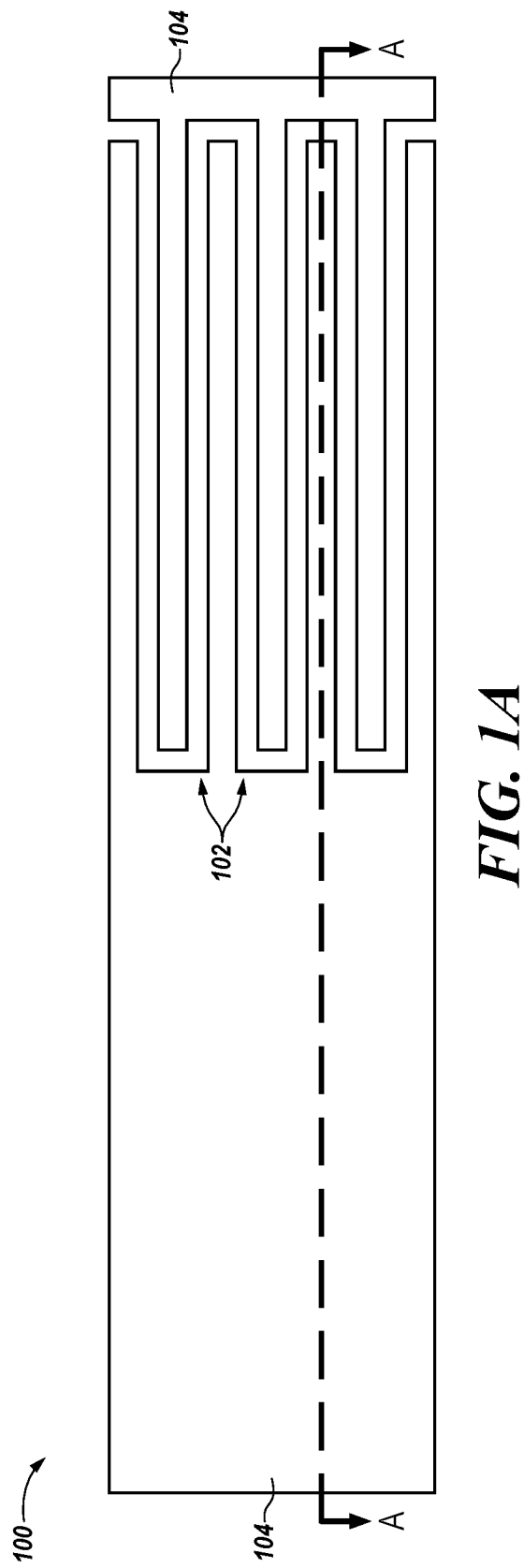

The present disclosure includes replacement gate formation in memory. For instance, the present disclosure includes methods of processing three-dimensional (3-D) memory arrays, which includes replacement gate formation and 3-D memory arrays formed in accordance with those methods. As used herein, "replacement gate formation" refers to processing of memory that includes formation of alternating layers of two insulating materials in contrast to, for example, processing of memory that includes formation of alternating layers of an insulating material and a conductive material. Replacement gate formation includes removal of the layers of one of the insulating materials and subsequently forming a conductive material in voids formed by removal of the layers of the insulating material. A number of embodiments include forming a first oxide material in an opening through alternating layers of two insulating materials a second oxide material and a nitride material. An array of openings can be formed through the first oxide material formed in the opening. The layers of the nitride material can be removed, and a metal material can be formed in voids resulting from the removal of the layers of the nitride material.

In some previous approaches to memory processing, replacement gate formation may occur subsequent to formation of memory cells. For example, replacement gate formation may occur subsequent to formation of memory cells of previous 3-D memory arrays. In such previous approaches, the memory cells may be subjected to high temperatures associated with the replacement gate formation, which may damage the memory cells (e.g., the storage element material of the cell). To avoid damaging the memory cells, the temperatures used during replacement gate formation may be limited (e.g., to a maximum temperature that can be tolerated by the memory cells without resulting in damage to the cell). Limiting the temperature used during the replacement gate formation, however, may unnecessarily constrain the formation of the replacement gate. For example, higher temperatures can be useful for formation of metal materials in openings and/or voids of a 3-D memory array, especially in high-aspect ratio openings and/or voids. As used herein, an opening having a "high aspect ratio" refers to an opening where the depth of the opening is at least twenty-five times greater than a width or diameter of the opening (e.g., an aspect ratio of at least 10:1).

A number of embodiments of the present disclosure eliminate this constraint by, in contrast to previous approaches, performing replacement gate formation prior to formation of memory cells. Accordingly, replacement gate formation, in accordance with the present disclosure, can occur at higher temperatures than those tolerable by the memory cells because the memory cells have not yet been formed. Because the replacement gate formation is not constrained, embodiments of the present disclosure can provide an interdigitated electrode structure for each tier of a 3-D memory array. As used herein, a "tier" refers to a pair of adjacent layers of an oxide material and a nitride material. The oxide material and the nitride material of the tiers serve as support materials of the 3-D memory array during and/or after processing of the 3-D memory array.

As used herein, "a", "an", or "a number of" can refer to one or more of something, and "a plurality of" can refer to two or more such things. For example, a memory device can refer to one or more memory devices, and a plurality of memory devices can refer to two or more memory devices.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1B, and a similar element may be referenced as 204 in FIG. 2B. The figures herein are not meant to imply or indicate specific dimensions.

FIGS. 1A-1B illustrate various views of a processing step associated with forming a 3-D memory array in accordance with an embodiment of the present disclosure. For example, FIG. 1A illustrates a top view of a 3-D memory array 100 after the processing step. FIG. 1B illustrates a schematic cross-sectional view of the 3-D memory array 100 along section line A-A in FIG. 1A after the processing step.

As illustrated by FIG. 1B, a plurality of alternating layers of an oxide material 104 and a nitride material 106 can be formed (e.g., deposited) on a substrate material (not shown). A non-limiting example of a substrate material can be a semiconductor wafer. A layer of the oxide material 104 and the directly adjacent layer of the nitride material 106 can be referred to as a tier of the 3-D memory array 100. The combined thickness of the layers of the oxide material 104 and the nitride material 106 of a tier can be referred to as a tier pitch. Although 10 tiers of the 3-D memory array 100 are illustrated by FIG. 1B, embodiments are not so limited. For example, the 3-D memory array 100 can include greater (e.g., at least 64 tiers, 300 tiers), or fewer, quantities of tiers.

As illustrated by FIGS. 1A-1B an opening 102 can be formed through the alternating layers of the oxide material 104 and the nitride material 106. FIG. 1A illustrates the opening 102 being a serpentine opening (e.g., a serpentine-shaped opening). However, embodiments of the present disclosure are not limited the opening being serpentine or being a single, continuous opening. For example, a number of embodiments can include a plurality of discrete openings formed through the alternating layers of the oxide material 104 and the nitride material 106.

An etching operation, such as a serpentine etch, can be performed to form the opening 102. A serpentine opening, such as the opening 102, can provide interdigitated "fingers" of the 3-D memory array 100 that can serve as word lines of the 3-D memory array 100. The opening 102 can be formed using a hardmask. As illustrated by cross-sectional view of FIG. 1B, the opening 102 is formed through the alternating layers of the oxide material 104 and the nitride material 106. The opening 102 can be a high aspect ratio opening.

FIGS. 2A-2B illustrate various views of a subsequent processing step associated with forming the 3-D memory array 200 in accordance with an embodiment of the present disclosure. For example, FIG. 2A illustrates a top view of the 3-D memory array 200 after the subsequent processing step. FIG. 2B illustrates a schematic cross-sectional view of the 3-D memory array 200 along the section line A-A in FIG. 2A after the subsequent processing step.

As illustrated by FIGS. 2A-2B, an oxide material 210 can be formed in the opening 202. Non-limiting examples of the oxide material 204 include tetraethyl orthosilicate (TEOS) and aluminum oxide (AlOx). The oxide material 210 can be a different material than the oxide material 204. Embodiments of the present disclosure are not limited to forming an oxide material (e.g., the oxide material 210) in the opening 202. For example, a dielectric material that has wet etch and/or dry etch selectivity to the nitride material 206 can be formed in the opening 202.

As illustrated by FIG. 2B, the oxide material 210 can completely fill the opening 202 through the alternating layers of the oxide material 204 and the nitride material 206. In a number of embodiments, the oxide material 210 can be formed via a deposition operation. The deposition of the oxide material 210 can be a highly conformal deposition due to the high aspect ratio of the opening 202. A chemical-mechanical polishing (CMP) operation can be performed to remove any excess of the oxide material 210.

FIG. 3 illustrates a schematic cross-sectional view of a subsequent processing step associated with forming the 3-D memory array 300 in accordance with an embodiment of the present disclosure. As illustrated by FIG. 3, a staircase structure 312 (e.g., a staircase-shaped structure) can be formed by removing portions of the alternating layers of the oxide material 304 and the nitride material 306. For instance, a different amount (e.g., a sequentially increasing amount) of each respective layer of oxide material 304 and nitride material 306 can be removed to form the staircase-shaped structure 312 shown in FIG. 3. Although the staircase structure 312 is illustrated including 6 tiers of the 3-D memory array 300, the staircase structure 312 can be formed on any number (e.g., all) of the tiers of the 3-D memory array 300. The staircase structure 312 can be formed by performing an etch operation on a peripheral area of a semiconductor wafer (not shown) on which the portions of the alternating layers of the oxide material 304 and the nitride material 306 are formed. Contacts can be formed on the staircase structure 312 in later processing steps associated with formation of the 3-D memory array 300.

FIG. 4 illustrates a schematic cross-sectional view of a subsequent processing step associated with forming the 3-D memory array 400 in accordance with an embodiment of the present disclosure. As illustrated by FIG. 4, an oxide material 414 can be formed on the staircase structure 412. The oxide material 414 can be a same material as or a different material than any of the oxide material 404 and the oxide material 410. A non-limiting example of the oxide material 414 can be TEOS. In a number of embodiments, the oxide material 414 can be formed via a deposition operation. A CMP operation can be performed to remove excess of the oxide material 414 from the oxide material 404. The CMP operation results in the topmost surface of the oxide material 414 and the topmost surface of the oxide material 404 to be coplanar or nearly coplanar.

FIGS. 5A-5B illustrate various views of a subsequent processing step associated with forming the 3-D memory array 500 in accordance with an embodiment of the present disclosure. For example, FIG. 5A illustrates a top view of the 3-D memory array 500 after the subsequent processing step. FIG. 5B illustrates a schematic cross-sectional view of the 3-D memory array 500 along the section line B-B in FIG. 5A after the subsequent processing step.

As illustrated by FIGS. 5A-5B, an array of openings 516 can be formed through the alternating layers of the oxide material 504 and the nitride material 506, and through the oxide material 514 and the staircase structure (the staircase structure 412 described in association with FIG. 4). Although FIG. 5A illustrates the array of openings 516 as having three rows of openings, the array of openings 516 can include greater, or fewer, quantities of rows of openings.

It is noted that the term "row" is used based on the orientation of the 3-D memory array 500 as illustrated by FIG. 5A. If FIG. 5A is rotated 90 degrees, then the term "column" could be used. The rows 522, 524, and 526 could be referred to as respective columns of the array of openings 516.

The array of openings 516 can be formed on a peripheral area of the alternating layers of the oxide material 504 and the nitride material 506 relative to a semiconductor wafer (not shown) on which the alternating layers of the oxide material 504 and the nitride material 506 are formed. A portion of the array of openings 516 can be used in later processing steps associated with formation of contacts of the 3-D memory array 500. As described further herein, the array of openings 516 can be used to form one or more support structures for the 3-D memory array 500. For instance, the array of openings 516 can be used to form a temporary support structure during further processing of the 3-D memory array. Further, the array of openings 516 can be used to form a permanent support structure that persists beyond processing of the 3-D memory array 500. A size of the openings of the array 516 and/or spacing between the openings of the array 516 can be based on support requirements of the 3-D memory array 500 during and/or after processing of the 3-D memory array 500 (e.g., during replacement gate formation as described herein).

Figure 6A:
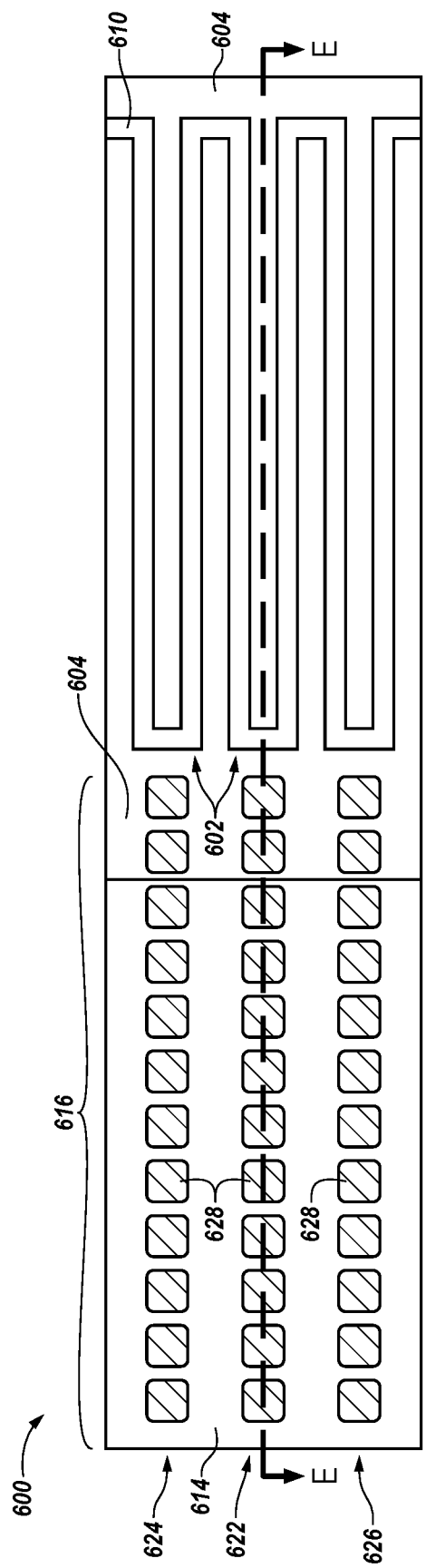

FIGS. 6A-6B illustrate various views of subsequent processing steps associated with forming the 3-D memory array 600 in accordance with an embodiment of the present disclosure. For example, FIG. 6A illustrates a top view of the 3-D memory array 600 after the subsequent processing steps. FIG. 6B illustrates a schematic cross-sectional view of the 3-D memory array 600 along the section line E-E in FIG. 6A after the subsequent processing steps.

FIG. 6A illustrates a polysilicon material 628 formed in (e.g., used to fill) the array of openings 616. As illustrated by FIG. 6A, the polysilicon material 628 can be formed in the array of openings 616. For example, the polysilicon material 628 is formed in rows 622, 624, and 626 of the array of openings 616.

The polysilicon material 628 can be formed in the array of openings 616 via a deposition operation, for example. A CMP operation can be performed subsequently to remove excess of the polysilicon material 628 from the oxide materials 604 and/or 614.

As illustrated by FIG. 6B, the polysilicon material 628 can fill openings of the array of openings 616 completely. The polysilicon material 628 formed in the array of opening 616 can provide a temporary support structure for the 3-D memory array 600 during processing of the 3-D memory array 600. For example, the polysilicon material 628 can provide support to prevent the staircase structure 612 from sagging and/or collapsing during further processing of the 3-D memory array 600.

Figure 7A:
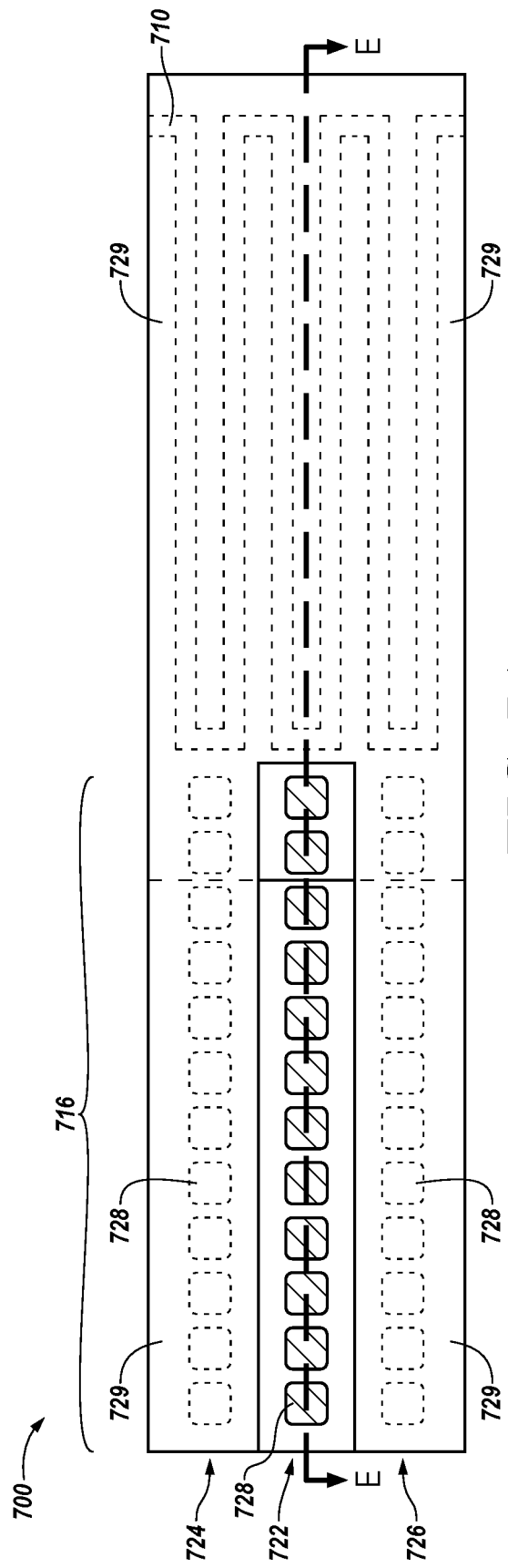

FIGS. 7A-7B illustrate various views of subsequent processing steps associated with forming the 3-D memory array 700 in accordance with an embodiment of the present disclosure. For example, FIG. 7A illustrates a top view of the 3-D memory array 700 after the subsequent processing steps. FIG. 7B illustrates a schematic cross-sectional view of the 3-D memory array 700 along the section line E-E in FIG. 7A after the subsequent processing steps.

As illustrated by FIGS. 7A-7B, a photoresist material 729 can be formed on the 3-D memory array 700. Subsequently, one or more portions of the photoresist material 729 can be removed from the 3-D memory array 700. For example, lithography can be used to remove a portion of the photoresist material 729 formed on openings of the array 716 in which an oxide material is to be formed (the openings of row 722). In other words, a portion of the photoresist material 729 formed over openings of the array 716 in which contacts are to be formed can be removed by lithography. A non-limiting example of lithography can be a stripe pattern.

Figure 8A:
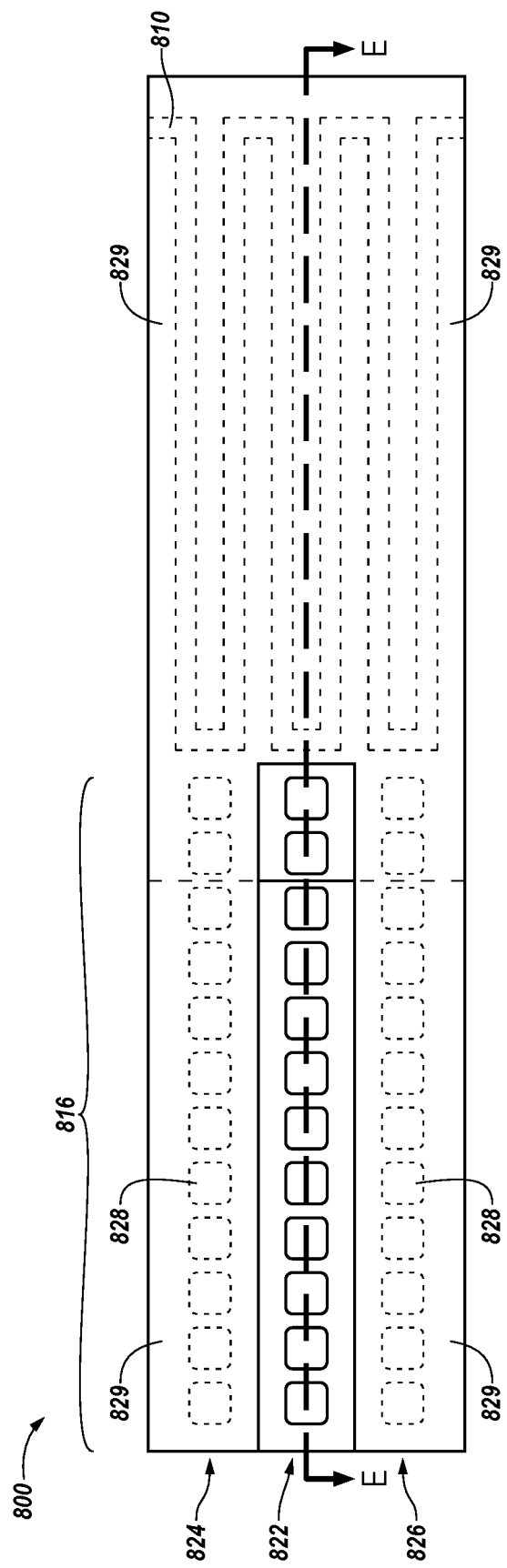

FIGS. 8A-8B illustrate various views of subsequent processing steps associated with forming the 3-D memory array 800 in accordance with an embodiment of the present disclosure. For example, FIG. 8A illustrates a top view of the 3-D memory array 800 after the subsequent processing steps. FIG. 8B illustrates a schematic cross-sectional view of the 3-D memory array 800 along the section line E-E in FIG. 8A after the subsequent processing steps.

As illustrated by FIGS. 8A-8B, the polysilicon material 828 can be selectively removed from a subset of the array of openings 816. The polysilicon material 828 can be selectively removed from openings of the array 816 that are not covered by the photoresist material 829 (the openings of row 822). The photoresist material 829 can prevent removal of the polysilicon material 828 from the remainder of the array of openings 816. In a number of embodiments, lithography can be performed to remove at least a portion of the polysilicon material 828 from respective openings of alternating rows of the array of openings 816. A non-limiting example of lithography can be a stripe pattern. An etch operation, such as a wet etch operation, can be performed to remove the polysilicon material 828 from the array of openings 816. For example, an etch operation can be performed to remove remains of the polysilicon material 828 in the subset of the array of openings 816 (e.g., the openings of the row 822) that was not removed by lithography. The etch operation can be performed using tetramethylammonium hydroxide (TMAH), for example.

Figure 9A:
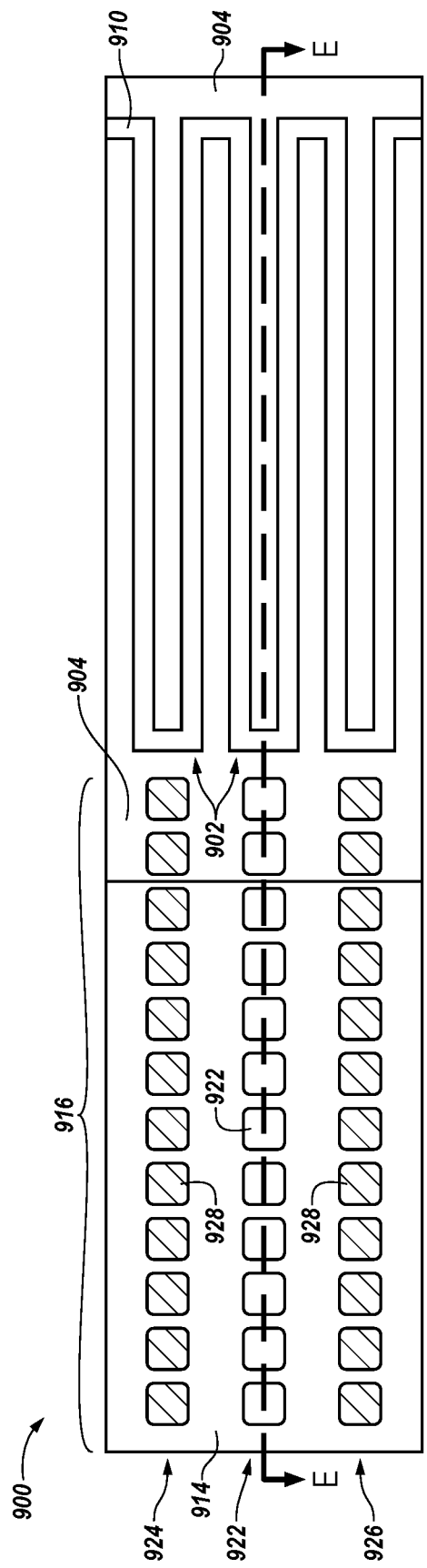

FIGS. 9A-9B illustrate various views of subsequent processing steps associated with forming the 3-D memory array 900 in accordance with an embodiment of the present disclosure. For example, FIG. 9A illustrates a top view of the 3-D memory array 900 after the subsequent processing steps. FIG. 9B illustrates a schematic cross-sectional view of the 3-D memory array 900 along the section line E-E in FIG. 9A after the subsequent processing steps.

As illustrated by FIGS. 9A-9B, the photoresist material can be removed from the 3-D memory array 900. The photoresist material can be removed subsequent to removal of the polysilicon material 928 from the subset of the array of openings 916. A photoresist strip can be performed to remove the photoresist material.

Figure 10A:
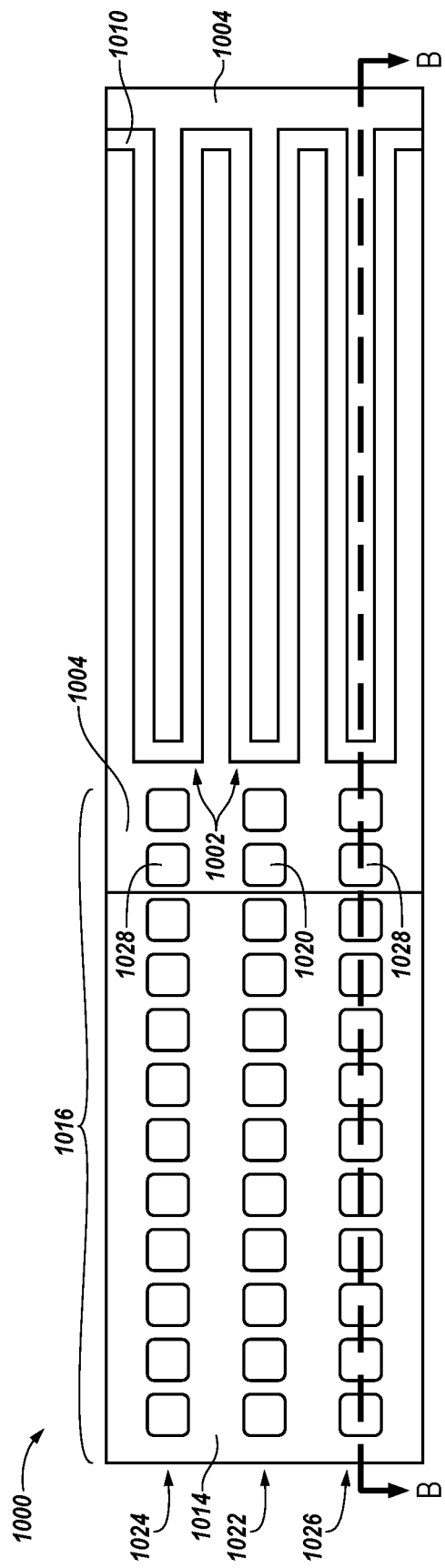

FIGS. 10A-10B illustrate various views of subsequent processing steps associated with forming the 3-D memory array 1000 in accordance with an embodiment of the present disclosure. For example, FIG. 10A illustrates a top view of the 3-D memory array 1000 after the subsequent processing steps. FIG. 10B illustrates a schematic cross-sectional view of the 3-D memory array 1000 along the section line B-B in FIG. 10A after the subsequent processing steps.

As illustrated by FIGS. 10A-10B, an oxide material 1020 can be formed in a subset of openings of the array 1016. For example, subsequent to the removal of the polysilicon material 1028 from the subset (e.g., the row 1022) of the array of openings 1016, the oxide material 1020 can be formed in the subset of the array of openings 1016 via a deposition operation, for example. A CMP operation can be performed subsequently to remove excess of the oxide material 1020 from the oxide material 1004, the oxide material 1014, and/or the polysilicon material 1028. The oxide material 1020 formed in the array of openings 1016 can persist during further processing of the 3-D memory array 1000 to provide a permanent support structure of the 3-D memory array 1000 in contrast to the temporary support structure provided by the polysilicon material 1028. The oxide material 1020 formed in the array of openings 1016 can be referred to as support pillars and can prevent the staircase structure 1012 from sagging and/or collapsing. Non-limiting examples of the oxide material 1020 can include TEOS, silicon oxide material, such as silicon dioxide ($SiO_2$), and AlOx. The oxide material 1020 can be a same material as or a different material than the oxide materials 1004 and/or 1010.

Figure 11A:
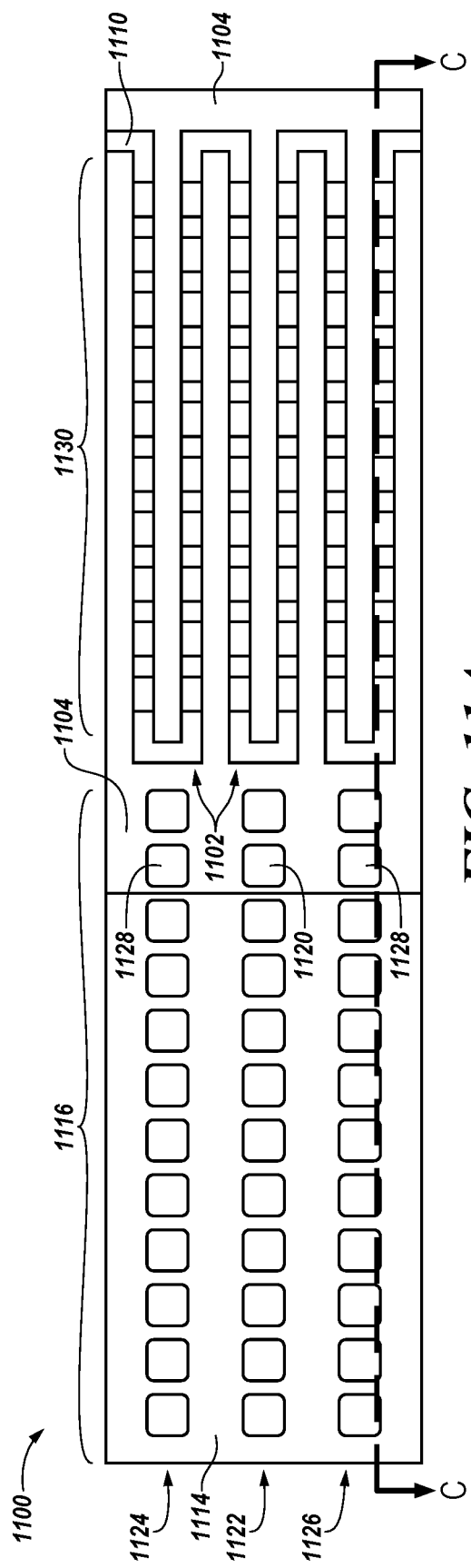

FIGS. 11A-11B illustrate various views of a subsequent processing step associated with forming the 3-D memory array 1100 in accordance with an embodiment of the present disclosure. For example, FIG. 11A illustrates a top view of the 3-D memory array 1100 after the subsequent processing step. FIG. 11B illustrates a schematic cross-sectional view of the 3-D memory array 1100 along the section line C-C in FIG. 11A after the subsequent processing step.

As illustrated by FIGS. 11A-11B, an array of openings 1130 can be formed through the oxide material 1110 formed in the opening 1102. In a number of embodiments, openings of the array of openings 1130 can extend into the layers of the oxide material 1104 and the nitride material 1106 but be primarily formed through the oxide material 1110 formed in the opening 1102. The array of openings 1130 can be associated with formation of an array of memory cells in subsequent processing steps of processing the 3-D memory array 1100. As illustrated by FIG. 11B, the array of openings 1130 can be formed through the entire depth of the oxide material 1110 formed in the opening 1102 such that the array of openings 1130 pass through all tiers of the 3-D memory array 1100. In a number of embodiments, the array of openings 1130 can be formed via a selective etch operation relative to the oxide material 1104 and the nitride material 1106. As described herein, the oxide material 1110 can be a support material.

Although described separately herein and formed separately, the array of openings 1116 and the array of openings 1130 can be considered as a single array of openings. The single array of openings can be considered as including two sections. One section can be the array of openings 1116 and another section can be the array of openings 1130. In some embodiments, the arrays of openings 1116 and 1130 can be formed concurrently are created simultaneously, but filled separately. For example, lithography can be used to mask one of the arrays of openings 1116 and 1130 with respect to the other one of the arrays of openings 116 and 1130.

Figure 12A:
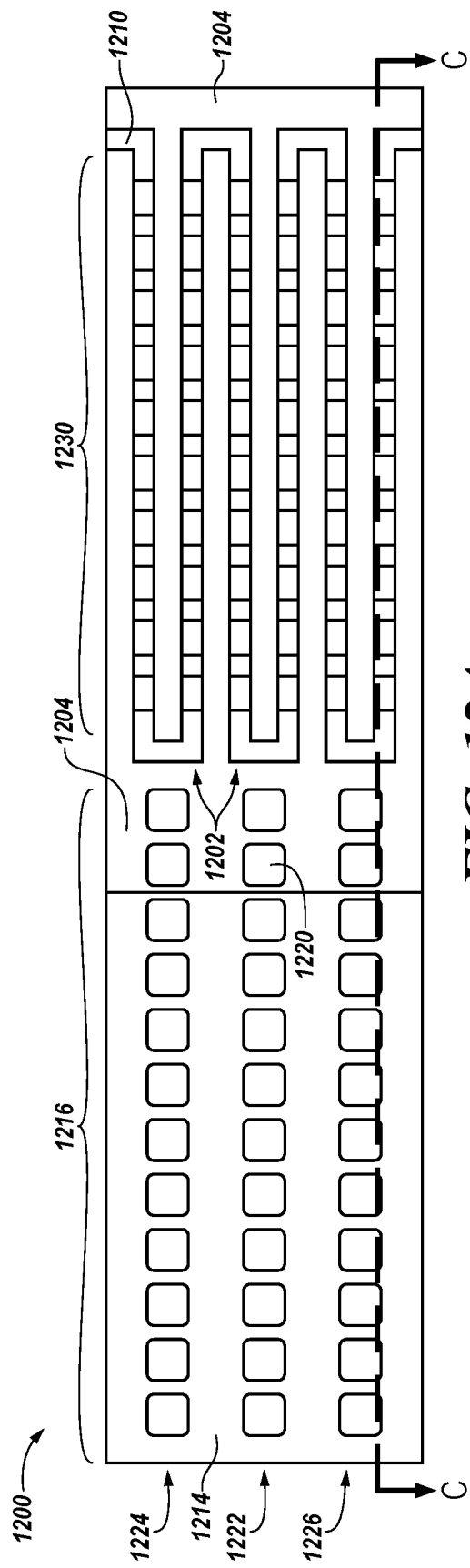

FIGS. 12A-12B illustrate various views of a subsequent processing step associated with forming the 3-D memory array 1200 in accordance with an embodiment of the present disclosure. For example, FIG. 12A illustrates a top view of the 3-D memory array 1200 after the subsequent processing step. FIG. 12B illustrates a schematic cross-sectional view of the 3-D memory array 1200 along the section line C-C in FIG. 12A after the subsequent processing step.

As illustrated by FIGS. 12A-12B, the polysilicon material 1228 (e.g., the polysilicon material 1128 described in association with FIGS. 11A-11B) can be removed from the array of openings 1216. The polysilicon material 1128 can be removed from the rows 1224 and 1226 of the array of openings 1216. The polysilicon material 1128 can be removed from the array of openings 1216 via an etch operation, for example. The etch operation can be a wet etch operation. The etch operation can be selective relative to the oxide materials 1204 and 1214 and/or the nitride material 806. The etch operation can be performed using TMAH, for example.

Figure 13A:
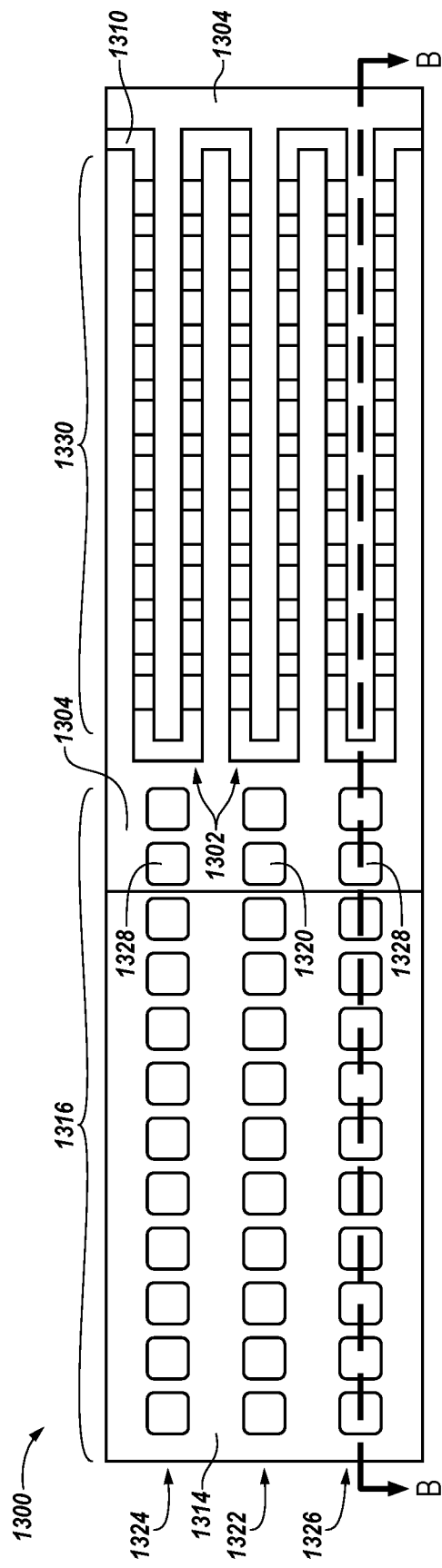

FIGS. 13A-13B illustrate various views of a subsequent processing step associated with forming the 3-D memory array 1300 in accordance with an embodiment of the present disclosure. For example, FIG. 13A illustrates a top view of the 3-D memory array 1300 after the subsequent processing step. FIG. 13B illustrates a schematic cross-sectional view of the 3-D memory array 1300 along the section line B-B in FIG. 13A after the subsequent processing step.

As illustrated by FIG. 13B, the layers of the nitride material (e.g., the nitride material 1206 described in association with FIGS. 12A-12B) can be removed from the 3-D memory array 1300, which can form voids between the layers of oxide material 1304 in 3-D memory array 1300, as described in association with FIGS. 13A-13B. In a number of embodiments, the layers of the nitride material can be removed from the 3-D memory array 1300 via wet nitride material strip processing. A hot phosphoric acid, for example can be used for the wet nitride strip processing. As described in association with FIGS. 6A-6B, the oxide material 1320 formed in the array of openings 1316 can provide support for the layers of the oxide material 1304. The oxide material 1310 formed in the opening 1302 (can be referred to as support pillars) can provide support for the layers of the oxide material 1304.

FIGS. 14A-14C illustrate various views of a subsequent processing step associated with forming the 3-D memory array 1400 in accordance with an embodiment of the present disclosure. For example, FIG. 14A illustrates a top view of the 3-D memory array 1400 after the subsequent processing step. FIG. 14B illustrates a schematic cross-sectional view of the 3-D memory array 1400 along the section line D-D in FIG. 14C after the subsequent processing step. FIG. 14B illustrates a word line of the 3-D memory array 1400. FIG. 14C illustrates a schematic cross-sectional view of the 3-D memory array 1400 along the section line B-B in FIGS. 14A-14B after the subsequent processing step.

As illustrated by FIGS. 14A-14C, a metal material 1434 can be formed in the voids of the 3-D memory array 1400 resulting from removal of the layers of the nitride material 1306 described in association with FIGS. 13A-13B. The metal material 1434 formed in the voids are replacement gates. A non-limiting example of the metal material 1434 can be a tungsten material. In a number of embodiments, the metal material 1434 can be formed in the voids via a deposition operation. The deposition operation can use a conformal tungsten material. In a number of embodiments, a nucleation layer material (not shown) can be formed in the voids prior to formation of the metal material 1434. A non-limiting example of a nucleation layer material can be a titanium nitride material. A CMP operation can be performed subsequently to remove excess of the metal material 1434 (and nucleation later material, if present) from topmost layers of the oxide materials 1404 and/or 1414.

As illustrated by FIGS. 14A-14C, the deposition operation can cause the metal material 1434 to be partially formed in the array of openings 1416 and the array of openings 1430. The thickness of the metal material 1434 can be such that the voids between the layers of the oxide material 1404 are filled completely but that the array of openings 1416 and the array of openings 1430 are filled partially, if at all. The height of the voids, which are dependent on the thickness of respective layers of the nitride material 1306, can be such that completely filling the voids with the metal material 1434 does not cause the array of openings 1416 and the array of openings 1430 to be pinched off by the metal material 1434.

FIGS. 15A-15C illustrate various views of a subsequent processing step associated with forming the 3-D memory array 1500 in accordance with an embodiment of the present disclosure. For example, FIG. 15A illustrates a top view of the 3-D memory array 1500 after the subsequent processing step. FIG. 15B illustrates a schematic cross-sectional view of the 3-D memory array 1500 along the section line D-D in FIG. 15C after the subsequent processing step. FIG. 15B illustrates word lines of the 3-D memory array 1500. The word lines are interdigitated and electrically isolated from one another. FIG. 15C illustrates a schematic cross-sectional view of the 3-D memory array 1500 along the section line B-B in FIGS. 15A-15B after the subsequent processing step.

As illustrated by FIGS. 15A-15C, the metal material 1534 can be removed from the array of openings 1516 and the array of openings 1530. In a number of embodiments, the metal material 1534 can be removed from the array of openings 1516 and the array of openings 1530 via an etch operation. The etch operation can be a wet etch operation. The etch operation can be controllably selective to remove the metal material 1534 from vertical surfaces of the array of openings 1516 and the array of openings 1530 while minimizing removal of the metal material 1534 from between the layers of the oxide material 1504. The etch operation can be selective relative to the oxide materials 1504, 1510, and/or 1514.

In a number of embodiments, a barrier layer material and/or a memory cell interfacial layer material (not shown) can be deposited in the voids prior to formation of the metal material 1534. The barrier layer material and/or the memory cell interfacial layer material can protect the oxide materials 1504, 1510, and/or 1514 from the etch operation to remove the metal material 1534 from the array of openings 1516 and the array of openings 1530. A non-limiting example of a barrier layer material and/or a memory cell interfacial layer material can be a titanium nitride material. The barrier layer material can be removed (subsequent to etch operation or during the etch operation), selectively relative to the oxide materials 1504, 1510, and 1514 and the metal 1134, to electrically isolate the metal material 1534 of a tier from the metal material 1534 of adjacent tiers (e.g., the tier above and the tier below).

FIGS. 16A-16C illustrate various views of a subsequent processing step associated with forming the 3-D memory array 1600 in accordance with an embodiment of the present disclosure. For example, FIG. 16A illustrates a top view of the 3-D memory array 1600 after the subsequent processing step. FIG. 16B illustrates a schematic cross-sectional view of the 3-D memory array 1600 along the section line D-D in FIG. 16C after the subsequent processing step. FIG. 16B illustrates a word line of the 3-D memory array 1600. FIG. 16C illustrates a schematic cross-sectional view of the 3-D memory array 1600 along the section line B-B in FIGS. 16A-16B after the subsequent processing step.

As illustrated by FIGS. 16A-16C, a polysilicon material 1636 can be formed in a subset of the array of openings 1616 (e.g., the rows 1624 and 1626) and the array of openings 1630 subsequent to formation of the metal material 1634. The polysilicon material 1636 can be formed via a deposition operation, for example. The polysilicon material 1636 can be formed in the array of openings 1630 via a same or different deposition operation that formed the polysilicon material 1636 in the array of openings 1616. If different deposition operations are used, then a different polysilicon material can be formed in the array of openings 1616 than in the array of openings 1630. A CMP operation can be performed subsequently to remove excess of the polysilicon material 1636 from the oxide materials 1604 and/or 1614. The polysilicon material 1636 can be formed in the same subset of the array of openings 1616 as the polysilicon material 628 as described in association with FIGS. 6A-6B. The polysilicon material 1636 can be a same material as or a different material than the polysilicon material 628. In a number of embodiments, a barrier layer material (not shown) can be formed in the subset of the array of openings 1616 prior to forming the polysilicon material 1636. The barrier layer material can prevent reactions between the metal material 1634 and the polysilicon material 1636. A non-limiting example of a barrier material can be titanium nitride.

As illustrated by FIG. 16C, the polysilicon material 1636 can fill openings of the array of openings 1616 completely. The polysilicon material 1636 can be a support material. The polysilicon material 1636 formed in the array of opening 1616 can provide a temporary support structure for the 3-D memory array 1600 during further processing of the 3-D memory array 1600. The polysilicon material 1636 can enable independent processing of an array of memory cells of the 3-D memory array 1600 (to be formed in the array of openings 1630) separate from processing of structures in the periphery of the 3-D memory array 1600.

FIGS. 17A-17C illustrate various views of subsequent processing steps associated with forming the 3-D memory array 1700 in accordance with an embodiment of the present disclosure. For example, FIG. 17A illustrates a top view of the 3-D memory array 1700 after the subsequent processing steps. FIG. 17B illustrates a schematic cross-sectional view of the 3-D memory array 1700 along the section line D-D in FIG. 17C after the subsequent processing steps. FIG. 17B illustrates a word line of the 3-D memory array 1700. FIG. 17C illustrates a schematic cross-sectional view of the 3-D memory array 1700 along the section line B-B in FIGS. 17A-17B after the subsequent processing steps.

As illustrated by FIGS. 17A-17C, a metal material 1738 can be formed in a subset of the array of openings 1716 (e.g., the rows 1724 and 1726). Forming the metal material 1738 can be associated with processing of contacts of the 3-D memory array 1700. A non-limiting example of the metal material 1738 can be a tungsten material or a titanium material.

In a number of embodiments, the polysilicon material 1636 formed in the array of openings 1716, as described in association with FIGS. 16A-16C, can be removed prior to forming the metal material 1738. The polysilicon material 1736 in the array of openings 1730 can prevent the metal material 1738 from forming in the array of openings 1730. Lithography can be performed to remove at least a portion of the polysilicon material 1636 from respective openings of alternating rows of the array of openings 1716. A non-limiting example of lithography can be a stripe pattern. The polysilicon material 1636 can be removed from the array of openings 1716 via an etch operation, for example. The etch operation can be a wet etch operation. The etch operation can be selective relative to the oxide materials 1704 and 1714. The etch operation can be performed using TMAH, for example. If the polysilicon material 1636 was formed on a barrier material, such as titanium nitride, then the etch operation can include removing the barrier layer material. The etch operation can include removing a barrier layer material using an ammonia peroxide mixture (APM).

In a number of embodiments, an oxide liner material 1740 can be formed in the array of openings 1716 prior to forming the metal material 1738 in the array of openings 1716. As illustrated by FIG. 17C, the oxide liner material 1740 is formed through the layers of the oxide material 1704 and the metal material 1734. The oxide liner material 1740 can electrically isolate the metal material 1734, which can comprise word lines of the 3-D memory array 1700, from the metal material 1738, which can comprise contacts of the 3-D memory array 1700. Non-limiting examples of the oxide liner material 1740 can include TEOS, silicon oxide material, such as silicon dioxide ($SiO_2$), and AlOx. The metal material 1738 can be formed on the oxide liner material 1740. The metal material 1738 can fill voids in the array of openings 1716 resulting from forming the oxide liner material 1740.

In a number of embodiments, the metal material 1738 can be formed in a subset of the array of openings 1716 via a deposition operation. A nucleation layer material (not shown) can be formed in the subset of the array of openings 1716 prior to formation of the metal material 1738. A non-limiting example of a nucleation layer material can be a titanium nitride material. A CMP operation can be performed subsequently to remove excess of the metal material 1738 from the oxide materials 1704 and/or 1714.

In a number of embodiments, processing of the 3-D memory array 1700 subsequent to forming the metal material 1738 can include removing the polysilicon material 1736 from the array of openings 1730. Lithography can be performed to remove at least a portion of the polysilicon material 1736 from the array of openings 1730. A non-limiting example of lithography can be a stripe pattern. The polysilicon material 1736 can be removed from the array of openings 1730 via an etch operation, for example. The etch operation can be a wet etch operation. The etch operation can be selective relative to the oxide materials 1704 and 1714. The etch operation can be performed using TMAH, for example. If the polysilicon material 1736 was formed on a barrier material, such as titanium nitride, then the etch operation can include removing the barrier layer material. The etch operation can include removing a barrier layer material using an APM. Subsequent to removing the polysilicon material 1736, processing of the 3-D memory array 1700 can include processing of an array of memory cells of the 3-D memory array 1700 in the openings resulting from removal of the polysilicon material 1736.

Although not specifically illustrated by FIGS. 1A-17C, memory cells can be formed in the array of openings 1730. Subsequent to removing the polysilicon material 1736 from the array of openings 1730 (e.g., by applying TMAH to the polysilicon material 1736), memory cells can be formed in the array of openings 1730 by forming a storage element material in the array of openings 1730. In some embodiments, the storage element material can be capable of storing at least two binary states of electronic information. The storage element material can be an active memory material, such as a chalcogenide material. The memory cells can include one or more electrodes on one or multiple sides of an active memory material to promote electrical connection to the metal material 1734 and to a conductive material formed in the array of openings 1730 subsequent to formation of electrodes and/or the active memory material. The conductive material can be referred to as a bitline and/or a channel. The memory cells can be isolated between the tiers of the metal material 1734 by any of a number of techniques known to persons of ordinary skill in the art (e.g., semiconductor processing).

Although not specifically illustrated as such, the 3-D memory array 1700 can be a multi-deck array. The tiers of the 3-D memory array 1700 illustrated by FIGS. 17A-17C can be considered a deck. Multi-deck processing can be performed in multiple ways. One way is to repeat of the processing described herein to form another deck on the deck illustrated in FIGS. 17A-17C. Another way is to fill all openings shown after FIG. 11 with a polysilicon material. Then the processing steps described in association with FIGS. 1-11 can be repeated to form another deck. The polysilicon material can then be removed from both decks (in a single operation) and the processing steps described in association with FIGS. 12-17C can be performed on the decks concurrently.

Figure 18:
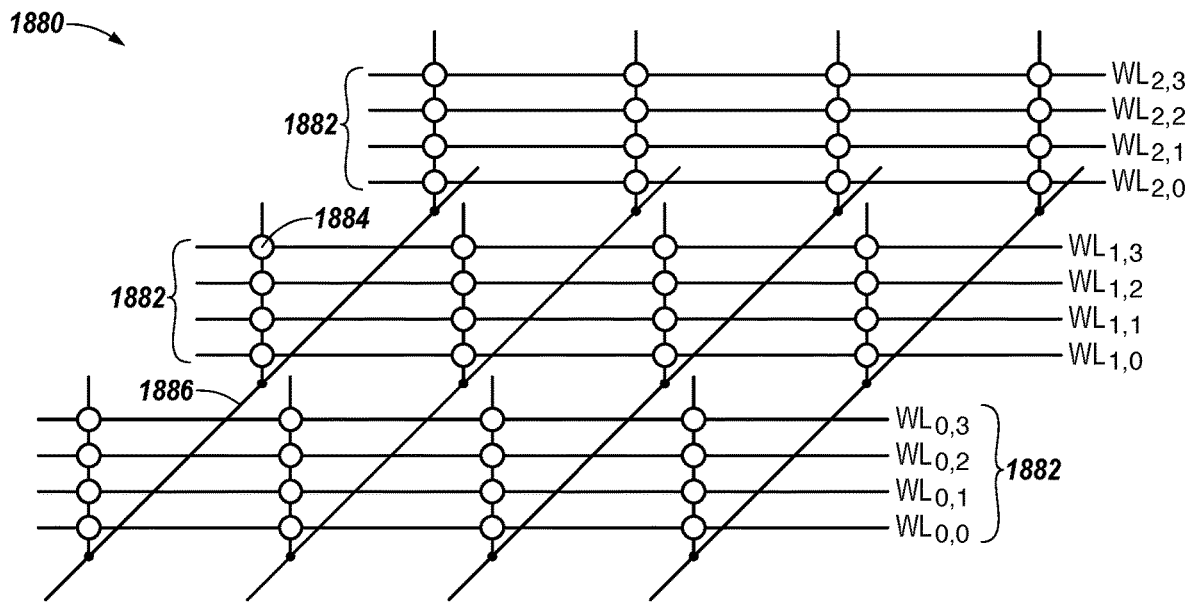
FIG. 18 illustrates a schematic of a 3-D memory array in accordance with an embodiment of the present disclosure.

FIG. 18 illustrates a schematic of a 3-D memory array 1880 in accordance with an embodiment of the present disclosure. The 3-D memory array 1880 can be processed according to the processing steps described in association with FIGS. 1A-17C. Although FIG. 18 illustrates a square or rectangular arrangement of a plurality of conductive lines 1882, a plurality of conductive lines 1886, and a plurality of memory cells 1884, it will be appreciated that FIG. 18 is a schematic representation of the 3-D memory array 1880 and that the plurality of conductive lines 1882, a plurality of conductive lines 1886, and a plurality of memory cells 1884 can be formed as described in association with FIGS. 1A-17C above.

As shown in FIG. 18, access lines (also referred to as word lines) can be disposed on a plurality of tiers. For example, access lines can be disposed on a quantity (N) of tiers. An insulation material, such as the layers of the oxide material 1704 illustrated by FIGS. 17A-17C, (not shown in FIG. 18 for clarity and so as not to obscure embodiments of the present disclosure) can separate the tiers of access lines, such as the metal material 1734. As such, the tiers of access lines separated by the insulation material can form a stack of access lines/insulation materials.

Data lines can be arranged substantially perpendicular to the access lines and located at a level above the N tiers of access lines (e.g., at the N+1 level). For example, the 3-D memory array 1880 can include a plurality of conductive lines 1882 (e.g., access lines) and a plurality of conductive lines 1886 (e.g., data lines). The plurality of conductive lines 1882 can be arranged into a plurality of tiers. As illustrated in FIG. 18, the plurality of conductive lines 1882 are arranged into tiers. The plurality of conductive lines 1882 are arranged substantially parallel to one another within each respective tier. The plurality of conductive lines 1882 can be aligned vertically in a stack. For instance, the plurality of conductive lines 1882 in each of the multiple tiers can be located at a same relative location within each respective tier so as to be aligned with the plurality of conductive lines 1882 in the tier directly above and/or below. An insulation material can be located between the tiers at which the plurality of conductive lines 1886 are formed.

As shown in FIG. 18, the plurality of conductive lines 1886 can be arranged substantially parallel to one another at a tier different than the tier at which the plurality of conductive lines 1882 are located (e.g., above the tiers at which the plurality of conductive lines 1882 are located). For instance, the plurality of conductive lines 1886 can be located at the bottom of the memory array 1880.

The indices shown in FIG. 18 for each of the plurality of conductive lines 1882 indicate a particular tier and the position (e.g., ordering) of the plurality of conductive lines 1882 within that tier. For example, the conductive line having the index $WL_{2,0}$ is located at position 2 within tier 0 (e.g., an access line of the 3-D memory array 1880 located at the bottom of a stack of access lines located at position 2). The conductive line having the index $WL_{2,3}$ is located at position 2 within tier 3 (e.g., an access line of the 3-D memory array 1880 located at the top of a stack of access lines located at position 2). The quantity of tiers into which the plurality of conductive lines 1882 can be arranged and the quantity of the plurality of conductive lines 1882 at each tier can be greater, or fewer, than the quantities shown in FIG. 18.

At each overlapping of one of the plurality of conductive lines 1886 and a stack of the plurality of conductive lines 1882, a conductive pillar is oriented substantially perpendicular to the plurality of conductive lines 1886 and the plurality of conductive lines 1882 so as to intersect a portion of each the plurality of conductive lines 1882 in the stack.

Figure 19:
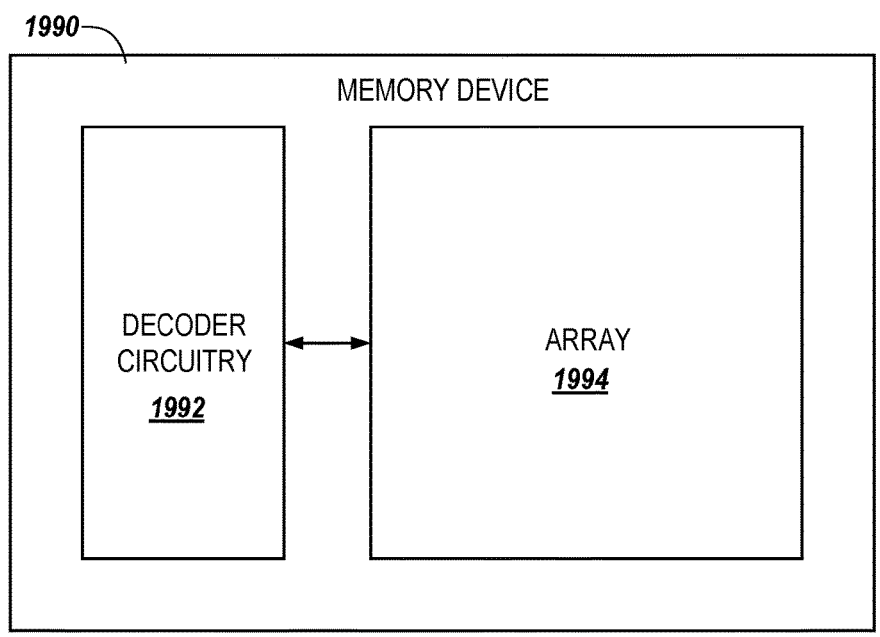
FIG. 19 is a block diagram of an apparatus in the form of a memory device in accordance with an embodiment of the present disclosure.

FIG. 19 is a block diagram of an apparatus in the form of a memory device 1990 in accordance with an embodiment of the present disclosure. As used herein, an "apparatus" can refer to, but is not limited to, any of a variety of structures or combinations of structures, such as a circuit or circuitry, a die or dies, a module or modules, a device or devices, or a system or systems, for example. As illustrated by FIG. 19, the memory device 1990 can include a 3-D memory array 1994. The 3-D memory array 1994 can be processed according to the processing steps described in association with FIGS. 1A-17C. Although FIG. 19 shows a single 3-D memory array 1994 for clarity and so as not to obscure embodiments of the present disclosure, the memory device 1990 may include any quantity of the 3-D memory array 1994.

As shown in FIG. 19, the memory device 1990 can include decoding circuitry 1992 coupled to the 3-D memory array 1994. The decoding circuitry 1992 can be included on the same physical device (e.g., the same die) as the 3-D memory array 1994. The decoding circuitry 1992 can be included on a separate physical device that is communicatively coupled to the physical device that includes the 3-D memory array 1994.

The decoding circuitry 1992 can receive and decode address signals to access the memory cells (e.g., the memory cells 1884 illustrated in FIG. 18) of the 3-D memory array 1994 during program and/or sense operations performed on the 3-D memory array 1994. For example, the decoding circuitry 1992 can include portions of decoder circuitry for use in selecting a particular memory cell of the 3-D memory array 1994 to access during a program or sense operation. For instance, a first portion of the decoder circuitry can be used to select a data line and a second portion of the decoder circuitry can be used to select an access line. The decoding circuitry 1992 can, during a program operation or sense operation performed on the 3-D memory array 1994, apply an access voltage to one of the plurality of vertical stacks (e.g., the vertical stacks shown in and described in association with FIG. 18) and one of the plurality of conductive lines (e.g., one of the plurality of conductive lines 1882).

The embodiment illustrated in FIG. 19 can include additional circuitry, logic, and/or components not illustrated so as not to obscure embodiments of the present disclosure. For example, the memory device 1990 can include a controller to send commands to perform operations on the 3-D memory array 1994, such as operations to sense (e.g., read), program (e.g., write), move, and/or erase data, among other operations. Further, the memory device 1990 can include address circuitry to latch address signals provided over input/output (I/O) connectors through I/O circuitry. Further, the memory device 1990 can include a main memory, such as, for instance, a DRAM or SDRAM, that is separate from and/or in addition to the memory array(s) 1994.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of processing memory, comprising:
   forming a first oxide material in an opening through alternating layers of a second oxide material and a nitride material;
   forming an array of openings through the alternating layers of the second oxide material and the nitride material;
   forming a third oxide material in a subset of the openings of the array;
   removing the layers of the nitride material; and
   forming a metal material in voids resulting from the removal of the layers of the nitride material.

2. The method of claim 1, wherein the method includes forming a polysilicon material in the openings of the array prior to forming the third oxide material.

3. The method of claim 2, wherein the method includes removing the polysilicon material from the subset of the openings of the array prior to forming the third oxide material.

4. The method of claim 1, wherein the method includes:
   forming a liner material in an additional subset of openings of the array; and
   forming an additional metal material in the additional subset of openings after forming the liner material.

5. The method of claim 1, wherein the method includes:
   forming the first oxide material in an opening through another set of alternating layers of the second oxide material and the nitride material formed on the alternating layers of the second oxide material and the nitride material;
   removing the layers of the nitride material from the other set of alternating layers of the second oxide material and the nitride material; and
   forming the metal material in voids resulting from the removal of the layers of the nitride material from the other set of alternating layers of the second oxide material and the nitride material.

6. The method of claim 1, wherein the method includes removing a portion of the metal material.

7. The method of claim 1, wherein the method includes forming the metal material in the voids by conformally depositing the metal material in the voids.

8. A memory, comprising:
   alternating layers of a first oxide material and a nitride material;
   a second oxide material formed through the alternating layers of the first oxide material and the nitride material; and
   a metal material formed in voids between the layers of the first oxide material from which the nitride material has been removed.

9. The memory of claim 8, wherein the memory includes a third oxide material formed through the alternating layers of the first oxide material and the nitride material.

10. The memory of claim 8, wherein the second oxide material is formed in a serpentine shape through the alternating layers of the first oxide material and the nitride material.

11. The memory of claim 8, wherein the metal material is a tungsten material.

12. The memory of claim 8, wherein a portion of the alternating layers of the first oxide material and the nitride material comprises a staircase structure.

13. The memory of claim 8, wherein the memory comprises a semiconductor wafer on which the alternating layers of the first oxide material and the nitride material are formed.

14. The memory of claim 8, wherein the metal material comprises replacement gates of the memory.

15. A method of processing memory, comprising:
   forming a serpentine opening through alternating layers of a first oxide material and a nitride material;
   forming a second oxide material in the serpentine opening;
   forming a polysilicon material in a first subset of an array of openings through the alternating layers of the first oxide material and the nitride material;

forming a third oxide material in a second subset of the array of openings through the alternating layers of the first oxide material and the nitride material;

removing the layers of the nitride material; and forming a metal material in voids between the layers of the first oxide material resulting from the removal of the layers of the nitride material.

16. The method of claim 15, wherein the polysilicon material formed in the first subset of the array of openings is a temporary support material.

17. The method of claim 15, wherein the third oxide material formed in the second subset of the array of openings is a temporary support material.

18. The method of claim 15, wherein the method includes removing a portion of the polysilicon material prior to removing the layers of the nitride material.

19. The method of claim 15, wherein the first subset of the array of openings and the second subset of the array of openings comprise alternating rows of the array of openings.

20. The method of claim 15, wherein the method includes removing portions of the alternating layers of the first oxide material and the second oxide material to form a staircase structure.

\* \* \* \* \*